United States Patent
Ge et al.

(10) Patent No.: US 10,980,030 B2
(45) Date of Patent: Apr. 13, 2021

(54) METHOD AND APPARATUS FOR WIRELESS COMMUNICATION USING POLARIZATION-BASED SIGNAL SPACE MAPPING

(71) Applicant: Huawei Technologies Co., Ltd., Shenzhen (CN)

(72) Inventors: Yiqun Ge, Ottawa (CA); Wuxian Shi, Ottawa (CA); Wen Tong, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/562,045

(22) Filed: Sep. 5, 2019

(65) Prior Publication Data

US 2020/0314827 A1 Oct. 1, 2020

Related U.S. Application Data

(60) Provisional application No. 62/826,034, filed on Mar. 29, 2019.

(51) Int. Cl.
| | |
|---|---|
| *G06F 9/44* | (2018.01) |
| *H04W 72/04* | (2009.01) |
| *H04B 7/10* | (2017.01) |
| *G06N 3/08* | (2006.01) |
| *G06N 3/04* | (2006.01) |
| *H04L 5/00* | (2006.01) |

(52) U.S. Cl.
CPC ........ *H04W 72/046* (2013.01); *G06N 3/0454* (2013.01); *G06N 3/08* (2013.01); *H04B 7/10* (2013.01); *H04L 5/0007* (2013.01)

(58) Field of Classification Search
CPC ..................................... G06N 3/08; H04B 7/10
See application file for complete search history.

(56) References Cited

U.S. PATENT DOCUMENTS

| 2008/0109041 A1* | 5/2008 | de Voir ..................... A61N 1/37 607/7 |
| 2016/0110176 A1* | 4/2016 | Fink ......................... G06F 8/443 717/137 |

FOREIGN PATENT DOCUMENTS

| CN | 102611713 A | 7/2012 |
| CN | 103281166 A | 9/2013 |
| CN | 103746708 A | 4/2014 |
| CN | 107909115 A | 4/2018 |

* cited by examiner

*Primary Examiner* — Mansour Oveissi
(74) *Attorney, Agent, or Firm* — Slater Matsil, LLP

(57) ABSTRACT

A polarization stream architecture is described. A transmitter may implement a reverse polarization stream to shape a first source signal in a first signal space to a first target signal in a second signal space. The reverse polarization stream is implemented as a cascade of reverse polarization steps. Each reverse polarization step includes a shuffle function, a split function, a scaling function and an offset function. Machine-learning techniques may be used to implement the scaling function and the offset function. A receiver may implement a polarization stream to recover the source signal.

19 Claims, 22 Drawing Sheets

410

```
[x1] ---(+)--- [y1]    y1 = x1+x2
         |
[x2] ----+---- [y2]    y2 = x2
```

420

$$G_2 = \begin{bmatrix} 1 & 0 \\ 1 & 1 \end{bmatrix}$$

430

$$G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

FIG. 5

METHOD AND APPARATUS FOR WIRELESS COMMUNICATION USING POLARIZATION-BASED SIGNAL SPACE MAPPING

CROSS-REFERENCE TO RELATED APPLICATIONS

The present disclosure claims priority from U.S. provisional patent application No. 62/826,034, filed Mar. 29, 2019, the entirety of which is hereby incorporated by reference.

FIELD

The present disclosure is related to methods and apparatuses for wireless communication, in which a polarization-based approach is used to map signals to a target signal space.

BACKGROUND

In a modern wireless system, a goal of the air interface is usually to increase system capacity (e.g., increase number of users and/or multiplexed data streams) given a limited bandwidth and time resource. In general, approaches to achieving this goal include adding new dimension(s) to a signal space and/or improving the resource allocation resolution of a signal space.

In practice, it is usually difficult to introduce an entirely new and good quality (e.g., as orthogonal as possible) dimension to the signal space. For example, the introductions of the coding and spatial domains, by code-division multiple access (CDMA) and multiple-input multiple-output (MIMO) technology respectively, to the time-frequency signal space are the only well-established and successful ones so far. Other improvements have been aimed at improving spectrum efficiency, that is, how to make better use of the existent signal space, for example orthogonal frequency-division multiplexing (OFDM)-based multiple access having higher spectrum efficiency than frequency-division multiple access (FDMA).

For future wireless developments (e.g., 5G and later generations), it will be desirable to further extend the signal space for larger capacity and higher spectrum efficiency. However, in doing so, it may be not possible to ensure that all dimensions remain orthogonal, and some dimensions may be non-linear. Conventional methods for designing resource mapping in a signal space (which typically uses a heuristic approach) may be difficult or impossible for such higher dimension signal spaces.

Furthermore, conventional transceivers (or transmitters and receivers separately) typically assume a normal (i.e., Gaussian) distribution for interferences and noisy channel randomness. Such an assumption may not be an accurate representation of the actual conditions, and may result in less efficient use of the signal space at both transmitter (encoder) and receiver (decoder) sides.

Accordingly, it would be useful, particularly for future wireless systems, to provide an approach that helps to facilitate signal space mapping for higher dimension signal spaces and a resultant general transceiver architecture that executes this higher-dimensional mapping, which may help to improve efficiency in using the signal space.

SUMMARY

In some aspects, the present disclosure describes an apparatus (which may be a base station or an electronic device) for wireless communications. The apparatus includes a transmitter configured to implement a reverse polarization stream to shape a first source signal in a first signal space (e.g., a lower dimensional signal space) to a first target signal in a second signal space (e.g., a higher dimensional signal space). The reverse polarization stream is implemented as a cascade of one or more reverse polarization steps. Each reverse polarization step includes: a shuffle function that shuffles an input set of information (e.g., real valued signals, complex valued signal, or bits) and outputs a shuffled set of information; a split function that splits the shuffled set of information and outputs a first split information group and a second split information group; a scaling function applied to the second split information group to generate a scaling vector (with the same dimension size as the first split information group); and an offset function applied to the second split information group to generate a offset vector (with the same dimension size as the first split information group). The reverse polarization step outputs a first output information group and a second output information group that together form an output set of information, the first output information group being: the first split information group element-wise multiplied with the scaling vector, and element-wise added with the offset vector; and the second output information group being the second split information group. The transmitter is further configured to transmit the first target signal to at least one recipient device.

In any of the above, the reverse polarization stream may be invertible to a polarization stream which recovers the first source signal from the first target signal (even after the addition of noise by a wireless channel), the shuffle function, split function, scaling function (by element-wise division) and offset function (by element-wise subtraction) being the same in the polarization stream.

In any of the above, the number of the reverse polarization steps can be more than one. All the reverse polarization steps can share a common shuffle function, split function, scaling function, and offset function. Or all the reverse polarization steps may not share the common shuffle function, split function, scaling function, and offset function. For example, each reverse polarization step may have its own shuffle function but may share the common split function, scaling function, and offset function.

In any of the above, the scaling function and the offset function may be implemented using at least one neural network. For example, one neural network can receive the second split information group as input and output the scaling vector and the offset vector, both of which have the same dimension size as the first split information group.

In any of the above, the scaling function (that generates the scaling vector from the second split information group) may be implemented using a first neural network, and the offset function (that generates the offset vector from the second split information group) may be implemented using a second neural network.

In any of the above, the reverse polarization stream may be invertible to a polarization stream which recovers the first source signal from the first target signal. The at least one neural network may be trained on the polarization stream.

In any of the above, the base station may be the transmitting apparatus, and the base station may be configured to transmit trained weights of the at least one neural network to at least one electronic device, to enable the at least one electronic device to implement the polarization stream in the role of a receiver. The electronic device may also be enabled to implement the reverse polarization stream in the role of a transmitter.

In some examples, the base station may inform the targeted electronic device(s) of the shuffle function, split function, scaling function, offset function, dimension size, and number of polarization steps for the polarization stream so that the electronic device(s) may implement the polarization stream as receiver. In examples where the electronic device acts as the transmitter for uplink communications, the base station may provide such information to the electronic device to enable the electronic device to implement the reverse polarization stream, and the base station (as the receiver) may implement the corresponding polarization stream. The base station may implement multiple polarization streams, each one designed to receive and decode uplink communications from a respective electronic device.

In any of the above, the electronic device may be the transmitting apparatus, and the electronic device may be configured to receive, from the base station, trained weights of the at least one neural network, to enable the electronic device to implement the reverse polarization stream in the role of a transmitter. The base station may implement the polarization stream in the role of a receiver.

In any of the above, the transmitter may be configured to implement a first reverse polarization stream to shape the first source signal to the first target signal, and a second reverse polarization stream to shape a second source signal in the first signal space (e.g., lower dimensional signal space) to a second target signal in the second signal space (e.g., higher dimensional signal space), wherein the first target signal is for transmission to a first recipient device and the second target signal is for transmission to a second recipient device.

In any of the above, the first and the second source signal may be overlapping in the first signal space, and the first and the second target signals may be non-overlapping in the second signal space (e.g., as a multiplexed signal).

In any of the above, the first source signal may be shaped to the first target signal to achieve dimensional gain.

In some aspects, the present disclosure describes an apparatus for wireless communications. The apparatus includes a receiver configured to receive a first received signal from the base station. The receiver is further configured to implement a polarization stream to recover a first source signal in a first signal space (e.g., lower dimensional signal space) from the first received signal in a second signal space (e.g., higher dimensional signal space). The polarization stream is implemented as a cascade of one or more polarization steps. Each polarization step includes: a shuffle function that shuffles an input set of information (e.g., real valued signals, complex valued signal, or bits) and outputs a shuffled set of information; a split function that splits the shuffled set of information and outputs a first split information group and a second split information group; a scaling function applied to the second split information group to generate a scaling vector (having the dimension size of the first split information group) from the second split information group; and an offset function applied to the second split information group to generate an offset vector (having the dimension size of the first split information group) from the second split information group. The polarization step outputs a first output information group and a second output information group that together form an output set of information, the first output information group being: the offset vector element-wise subtracted from the first split information group, and element-wise divided by the scale vector; and the second output bit group being the second split information group.

In any of the above, the scaling function and the offset function may be implemented using at least one neural network.

In any of the above, the scaling function may be implemented using a first neural network, and the offset function may be implemented using a second neural network.

In any of the above, the at least one neural network may be trained on the polarization stream, the polarization stream being invertible to a reverse polarization stream which shapes the first source signal to a first target signal for transmission.

In any of the above, the apparatus may be a base station in the role of a receiver, and the base station may be configured to transmit trained weights of the at least one neural network to at least one electronic device, to enable the at least one electronic device to implement the reverse polarization stream in the role of a transmitter.

In any of the above, the apparatus may be the electronic device, and the at least one neural network may be implemented using trained weights received from the base station.

In any of the above, the apparatus may be a base station in communication with a first electronic device and a second electronic device, and the receiver may be configured to implement a first polarization stream for recovering the first source signal, from the first electronic device, from a received multiplexed signal, and may be further configured to implement a second polarization stream for recovering a second source signal, from the second electronic device, from the received multiplexed signal.

In any of the above, the receiver may be further configured to implement a reverse polarization stream that is an inverse of the polarization stream, and may be further configured to iteratively use the polarization stream and the reverse polarization stream to recover the first source signal.

In some aspects, the present disclosure describes an apparatus for evaluating candidate signals. The apparatus includes: a processor configured to implement a neural network, the neural network being trained to perform binary classification between two candidate signal distributions in a signal space and to output a cross entropy value between the two candidate signal distributions. The two candidate signal distributions are determined to be satisfactory when the cross entropy value is at a maximum.

In any of the above, the two candidate signal distributions may represent the probabilities of the corresponding candidate signals that would be received at two different electronic devices.

BRIEF DESCRIPTION OF THE DRAWINGS

Reference will now be made, by way of example, to the accompanying drawings which show example embodiments of the present application, and in which:

FIG. 5 shows an example polarization kernel and example generator matrix for a polar encoder;

Similar reference numerals may have been used in different figures to denote similar components.

DESCRIPTION OF EXAMPLE EMBODIMENTS

Figure 1:
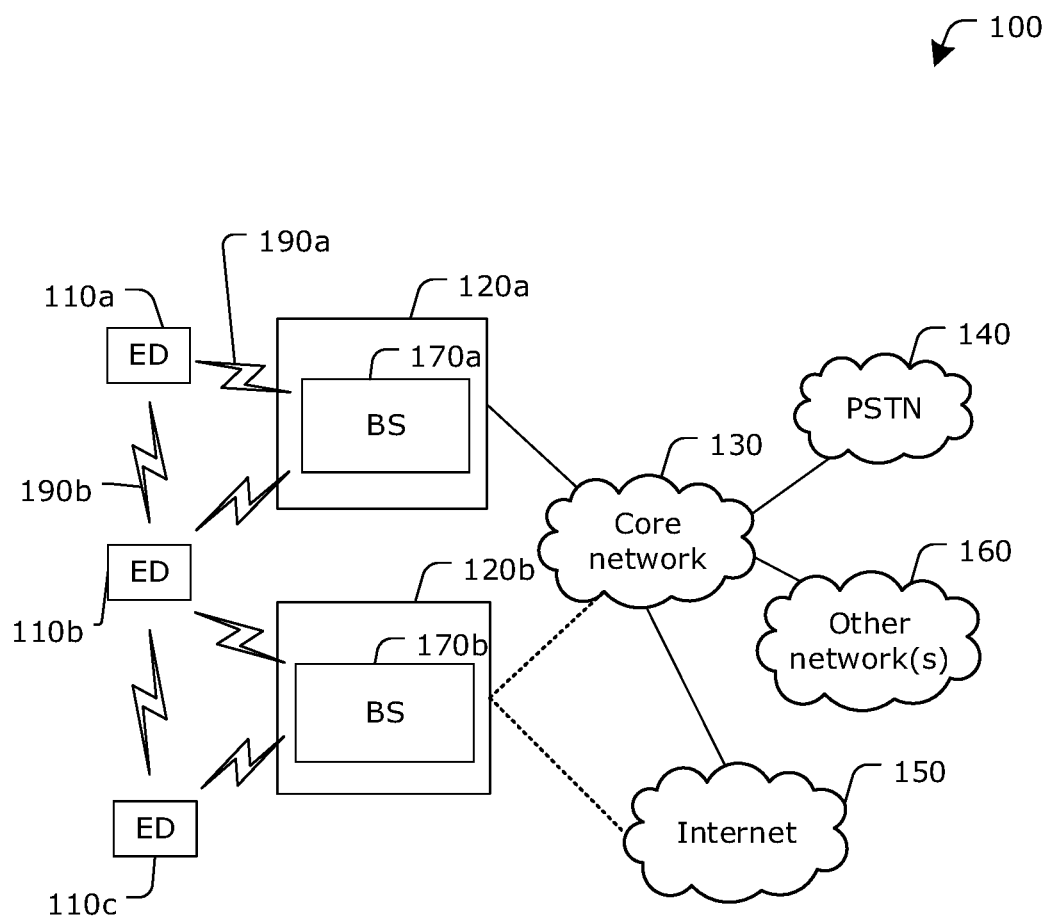
FIG. 1 is a schematic diagram of an example communication system suitable for implementing examples described herein.

The present disclosure describes examples that may be used to design new air interfaces for wireless communication. Examples described herein may help enable implementation of higher dimensional signal spaces and/or enable more efficient resource allocation for a signal space.

There have been wireless technologies that aim to extend the dimensionality of a signal space. One example is multiple-access (MA) technology. MA technology has been used for massive machine type communication (mMTC) to enable wireless communications when there is a high number and high density of devices (e.g., Internet of things (IoT) devices). For a simple example of MA multiplexing, the time and frequency dimensions define a basic, orthonormal, and linear 2D signal space in technologies such as frequency-division multiple access (FDMA) and time-division multiple access (TDMA). In code-division multiple access (CDMA) technology, the code domain was introduced as a third dimension. Multiplexed signals overlapping on the 2D frequency-and-time sub-space may be well-separated on the code dimension such that, overall, the signals are separated on the code-frequency-time signal space. Similarly, multiple-input multiple-output (MIMO) technology added the space domain as an additional dimension to extend the signal space for improving capacity. Channel coding technology, such as forward error correction (FEC), may also be regarded as a dimensional extension. An encoder adds redundancy information to source information, generating codewords. The dimension of coded bits is greater than that of source information bits. The coding rate (i.e., number of information bits compared to number of coded bits) may be considered a dimensional ratio. Generally, increasing the dimensionality of the signal space may help to increase system capacity.

Additional signal dimensions may not be as orthonormal and linear as the frequency and time signal dimensions. Nonetheless, additional dimensions may help to separate multiple users and/or multiplexed signals in a multiple-dimensional signal space. Adding dimensions (e.g., in addition to frequency and time dimensions) in a system means that each resource element becomes a higher dimension, generally increasing complexity in the system. In the present disclosure, higher dimension is used to refer to dimensionality that is higher than two (e.g., one or more dimensions in addition to time and frequency), and may refer more specifically to dimensionality that is higher than current wireless access technologies.

Another approach to improving system capacity may be to improve the spectrum efficiency of the system. Spectrum efficiency may refer to whether there is full use of a given signal space. Multiplexed signals in a D-dimensional signal space may be considered to be low-dimensional manifolds in a higher dimensional space. In this context, the spectrum efficiency problem may be considered as: how many manifolds can be placed in a given signal space (having a finite number of dimensions) without introducing unacceptable levels of interference. Generally, the higher the resolution of the signal space, the more flexibly a transmitter can arrange the signal manifolds within acceptable levels of interference, thus enabling more capacity. Some examples of increasing signal space include the development of orthogonal frequency-division multiplexing (OFDM)-based multiple access from FDMA, the development of wideband CDMA (WCDMA) from CDMA, and the decrease in the length of the transmission time interval (TTI) from 2G to 5G technology.

Development of future wireless communication technology may be expected to be concerned with finding and adding new dimensions to the signal space, and increasing resolution on existing (or new) signal dimensions. To assist in understanding the present disclosure, an example wireless communication system is described below.

FIG. 1 illustrates an example wireless communication system 100 (also referred to as wireless system 100) in which embodiments of the present disclosure could be implemented. In general, the wireless system 100 enables multiple wireless or wired elements to communicate data and other content. The wireless system 100 may enable content (e.g., voice, data, video, text, etc.) to be communicated (e.g., via broadcast, narrowcast, user device to user device, etc.) among entities of the system 100. The wireless system 100 may operate by sharing resources such as bandwidth. The wireless system 100 may be suitable for wireless communications using 5G technology and/or later generation wireless technology (e.g., 6G or later). In some examples, the wireless system 100 may also accommodate some legacy wireless technology (e.g., 3G or 4G wireless technology).

In the example shown, the wireless system 100 includes electronic devices (ED) 110a-110c (generically referred to as ED 110), radio access networks (RANs) 120a-120b (generically referred to as RAN 120), a core network 130, a public switched telephone network (PSTN) 140, the internet 150, and other networks 160. In some examples, one or more of the networks may be omitted or replaced by a different type of network. Other networks may be included in the wireless system 100. Although certain numbers of these components or elements are shown in FIG. 1, any reasonable number of these components or elements may be included in the wireless system 100.

The EDs 110 are configured to operate, communicate, or both, in the wireless system 100. For example, the EDs 110 may be configured to transmit, receive, or both via wireless or wired communication channels. Each ED 110 represents any suitable end user device for wireless operation and may include such devices (or may be referred to) as a user equipment/device (UE), a wireless transmit/receive unit (WTRU), a mobile station, a fixed or mobile subscriber unit, a cellular telephone, a station (STA), a machine type communication (MTC) device, a personal digital assistant (PDA), a smartphone, a laptop, a computer, a tablet, a wireless sensor, or a consumer electronics device, among other possibilities. Future generation EDs 110 may be referred to using other terms.

In FIG. 1, the RANs 120 include base stations (BSs) 170a-170b (generically referred to as BS 170), respectively. Each BS 170 is configured to wirelessly interface with one or more of the EDs 110 to enable access to any other BS 170, the core network 130, the PSTN 140, the internet 150, and/or the other networks 160. For example, the BS 170s may include (or be) one or more of several well-known devices, such as a base transceiver station (BTS), a radio base station, a Node-B (NodeB), an evolved NodeB (eNodeB), a Home eNodeB, a gNodeB (sometimes called a next-generation Node B), a transmission point (TP), a transmit and receive point (TRP), a site controller, an access point (AP), or a wireless router, among other possibilities. Future generation BSs 170 may be referred to using other terms. Any ED 110 may be alternatively or additionally configured to interface, access, or communicate with any other BS 170, the internet 150, the core network 130, the PSTN 140, the other networks 160, or any combination of the preceding. The wireless system 100 may include RANs, such as RAN 120b, wherein the corresponding BS 170b accesses the core network 130 via the internet 150, as shown.

The EDs 110 and BSs 170 are examples of communication equipment that can be configured to implement some or all of the functionality and/or embodiments described herein. In the embodiment shown in FIG. 1, the BS 170a forms part of the RAN 120a, which may include other BSs, base station controller(s) (BSC), radio network controller(s) (RNC), relay nodes, elements, and/or devices. Any BS 170 may be a single element, as shown, or multiple elements, distributed in the corresponding RAN, or otherwise. Also, the BS 170b forms part of the RAN 120b, which may include other BSs, elements, and/or devices. Each BS 170 transmits and/or receives wireless signals within a particular geographic region or area, sometimes referred to as a "cell" or "coverage area". A cell may be further divided into cell sectors, and a BS 170 may, for example, employ multiple transceivers to provide service to multiple sectors. In some embodiments there may be established pico or femto cells where the radio access technology supports such. A macro cell may encompass one or more smaller cells. In some embodiments, multiple transceivers could be used for each cell, for example using multiple-input multiple-output (MIMO) technology. The number of RANs 120 shown is exemplary only. Any number of RANs may be contemplated when devising the wireless system 100.

The BSs 170 communicate with one or more of the EDs 110 over one or more air interfaces 190a using wireless communication links (e.g. radio frequency (RF), microwave, infrared (IR), etc.). The EDs 110 may also communicate directly with one another via one or more sidelink air interfaces 190b. The interfaces 190a and 190b may be generally referred to as air interfaces 190. BS-ED communications over interfaces 190a and ED-ED communications over interfaces 190b may use similar communication technology. For example, the polarization stream architecture disclosed herein may be used for BS-ED communications and may also be used for ED-ED communications. The air interfaces 190 may utilize any suitable radio access technology. For example, the wireless system 100 may implement one or more channel access methods, such as code division multiple access (CDMA), time division multiple access (TDMA), frequency division multiple access (FDMA), orthogonal FDMA (OFDMA), or single-carrier FDMA (SC-FDMA) in the air interfaces 190. In accordance with examples described herein, the air interfaces 190 may utilize other higher dimension signal spaces, which may involve a combine of orthogonal and/or non-orthogonal dimensions. Using examples described herein, a new access technology for the air interfaces 190 may be implemented, in addition to or in place of the channel access methods mentioned above.

The RANs 120 are in communication with the core network 130 to provide the EDs 110 with various services such as voice, data, and other services. The RANs 120 and/or the core network 130 may be in direct or indirect communication with one or more other RANs (not shown), which may or may not be directly served by core network 130, and may or may not employ the same radio access technology as RAN 120a, RAN 120b or both. The core network 130 may also serve as a gateway access between (i) the RANs 120 or EDs 110 or both, and (ii) other networks (such as the PSTN 140, the internet 150, and the other networks 160). In addition, some or all of the EDs 110 may include functionality for communicating with different wireless networks over different wireless links using different wireless technologies and/or protocols. Instead of wireless communication (or in addition thereto), the EDs 110 may communicate via wired communication channels to a service provider or switch (not shown), and to the internet 150. PSTN 140 may include circuit switched telephone networks for providing plain old telephone service (POTS). Internet 150 may include a network of computers and subnets (intranets) or both, and incorporate protocols, such as Internet Protocol (IP), Transmission Control Protocol (TCP), User Datagram Protocol (UDP). EDs 110 may be multimode devices capable of operation according to multiple radio access technologies, and incorporate multiple transceivers necessary to support such.

Figure 2:
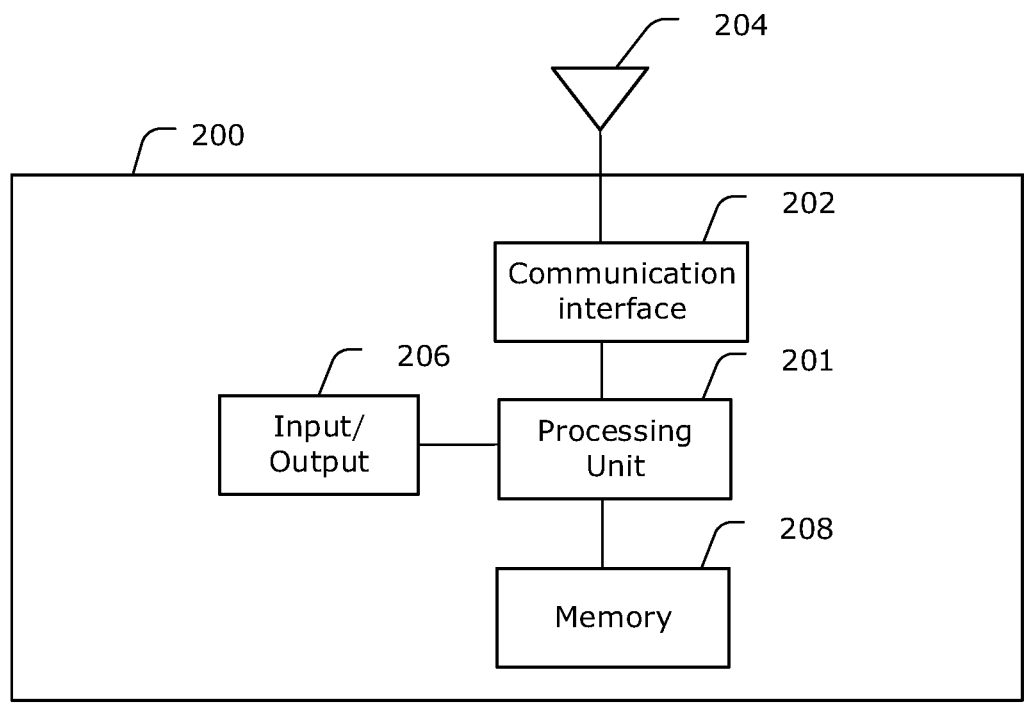
FIGS. 2 and 3 are block diagrams showing an example computing unit and an example base station/electronic device, respectively, suitable for implementing examples described herein.
Figure 3:
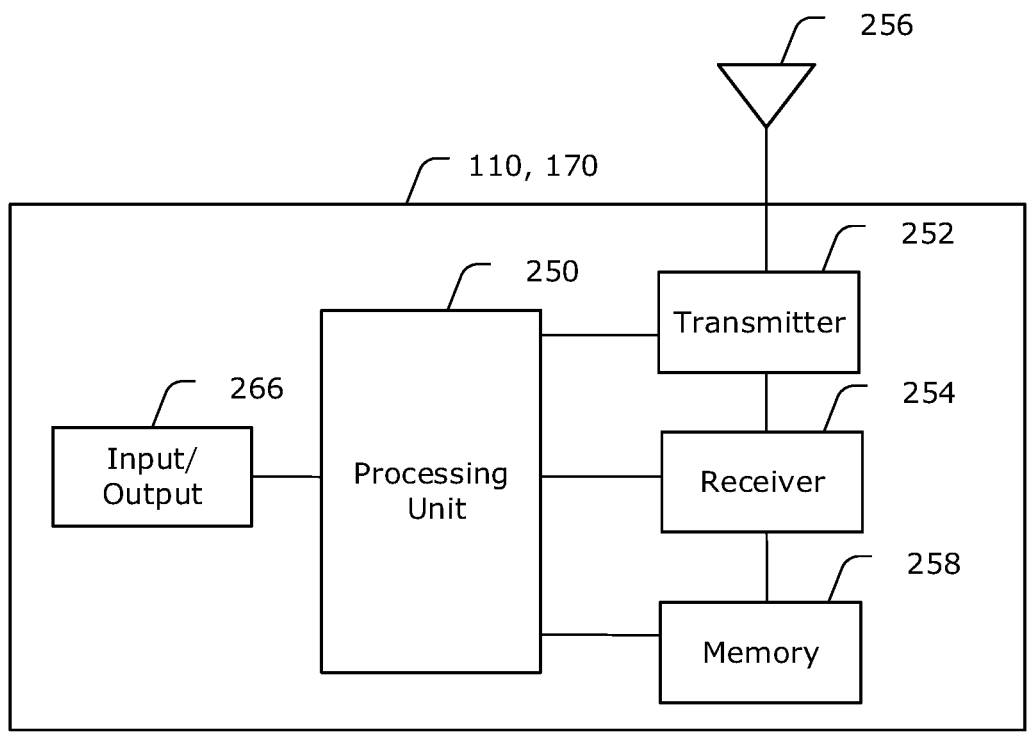

FIGS. 2 and 3 illustrate example devices that may implement the methods and teachings according to this disclosure. In particular, FIG. 2 illustrates an example computing unit (e.g., server or data center) 200, and FIG. 3 illustrates an example BS 170 or ED 110. These components could be used in the wireless system 100 or in any other suitable system.

As shown in FIG. 2, the computing unit 200 includes at least one processing unit 201. The processing unit 201 implements various processing operations of the computing unit 200. For example, the processing unit 201 could perform signal coding, data processing, power control, input/output processing, or any other functionality of the computing unit 200. The processing unit 201 may also be configured to implement some or all of the functionality and/or embodiments described in more detail herein. Each processing unit 201 includes any suitable processing or computing device configured to perform one or more operations. Each processing unit 201 could, for example, include a microprocessor, microcontroller, digital signal processor, field programmable gate array, or application specific integrated circuit.

The computing unit 200 also includes at least one communication interface 202 for wired and/or wireless communications. Each communication interface 202 includes any suitable structure for generating signals for wireless or wired transmission and/or processing signals received wirelessly or by wire. The computer unit 200 in this example includes at least one antenna 204 (in other examples, the antenna 204 may be omitted). Each antenna 204 includes any suitable structure for transmitting and/or receiving wireless or wired signals. One or multiple communication interfaces 202 could be used in the computing unit 200. One or multiple antennas 204 could be used in the computing unit 200. In some examples, one or more antennas 204 may be an antenna array 204, which may be used to perform beamforming and beam steering operations. Although shown as a single functional unit, a computing unit 200 could also be implemented using at least one transmitter interface and at least one separate receiver interface.

The computing unit 200 further includes one or more input/output devices 206 or input/output interfaces (such as a wired interface to the internet 150). The input/output device(s) 206 permit interaction with a user or other devices in the network. Each input/output device 206 includes any suitable structure for providing information to or receiving information from a user, such as a speaker, microphone, keypad, keyboard, display, or touchscreen, including network interface communications.

In addition, the computing unit 200 includes at least one memory 208. The memory 208 stores instructions and data used, generated, or collected by the computing unit 200. For example, the memory 208 could store software instructions or modules configured to implement some or all of the functionality and/or embodiments described herein and that are executed by the processing unit(s) 201. Each memory 208 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 3, the ED 110 or base station 170 includes at least one processing unit 250, at least one transmitter 252, at least one receiver 254, one or more antennas 256, at least one memory 258, and one or more input/output devices or interfaces 266. The processing unit 250 implements various processing operations of the ED 110 or base station 170, such as signal coding, data processing, power control, input/output processing, or any other functionality. The processing unit 250 can also be configured to implement some or all of the functionality and/or embodiments described herein. Each processing unit 250 includes any suitable processing or computing device configured to perform one or more operations. Each processing unit 250 could, for example, include a microprocessor, microcontroller, digital signal processor, field programmable gate array, or application specific integrated circuit.

Each transmitter 252 includes any suitable structure for generating signals for wireless or wired transmission. Each receiver 254 includes any suitable structure for processing signals received wirelessly or by wire. Although shown as separate components, at least one transmitter 252 and at least one receiver 254 could be combined into a transceiver. Each antenna 256 includes any suitable structure for transmitting and/or receiving wireless or wired signals. Although a common antenna 256 is shown here as being coupled to both the transmitter 252 and the receiver 254, one or more antennas 256 could be coupled to the transmitter(s) 252, and one or more separate antennas 256 could be coupled to the receiver(s) 254. In some examples, one or more antennas 256 may be an antenna array, which may be used for beamforming and beam steering operations. Each memory 258 includes any suitable volatile and/or non-volatile storage and retrieval device(s) such as those described above with respect to FIG. 2. The memory 258 stores instructions and data used, generated, or collected by the ED 110 or base station 170. For example, the memory 258 could store software instructions or modules configured to implement some or all of the functionality and/or embodiments described herein and that are executed by the processing unit(s) 250.

Each input/output device/interface 266 permits interaction with a user or other devices in the network. Each input/output device/interface 266 includes any suitable structure for providing information to or receiving/providing information from a user, including network interface communications.

Referring back to FIG. 1, generally the air interface 190 may make use of access technologies that use multiple dimensions. Development of new access technologies may involve a combination of different dimensions such as frequency, time, code, space, interleaver, multiple transceivers (e.g., coordinated multi-point (CoMP) and dual-connectivity technologies), and so on. Some dimensions are not as orthonormal as frequency and time dimensions, and some dimensions are non-linear, and some orthonormality changes with time. This presents challenges for development of a new air interface. It may also be desirable for the resolutions of the signal space to be adaptable to channel conditions, which are usually time varying. For example, if the frequency became less selective, it may be useful to adapt by increasing the resolution along the frequency dimension (e.g., by reducing OFDM sub-carrier spacing). In another example, if timing coherence became long, it may be useful to adapt by increasing the length of the TTI. Such adaptability may further add complexity to development of a new air interface.

An air interface may be regarded as performing the task of mapping one set of 1-dimensional input signals (e.g., a block of regular quadrature amplitude modulation (QAM) symbols) of one ED onto a block of signals in a specific D-dimensional signal space in a specific way. A number of blocks of the signals yield a manifold (representing a likelihood distribution) within the D-dimensional signal space. It should be noted that a manifold may not be isotopic (that is, the manifold may not be equally extended over all the dimensions) because it may be desirable for two manifolds for two different EDs to be separated from each other in the common signal space. For example, one manifold may be more extended over dimension A and the other manifold may be more extended over dimension B. Typically, a conventional air interface defines and provides a mechanism for how to generate a non-isotopic manifold step-by-step heuristically from a block of regular signals, and defines how to tune the manifold heuristically if channel conditions are changed.

However, the heuristic approach may not be suitable to produce and tune a manifold in a higher dimension and/or higher resolution signal space. The complexity of higher dimensions (which may include orthogonal or non-orthogonal dimensions, and which may be linear or non-linear, and which may be time varying or static) may make it difficult or even impossible to use a heuristic approach for higher dimension signal spaces. Even if a heuristic approach could be defined, higher dimensions and higher resolution typically requires a more complex physical layer and resource scheduler as well as more measurements and feedbacks. Conventional specification-driven tuning methods are generally time and resource consuming.

Another difficulty encountered with conventional approaches is that conventionally, transmitters and receivers (or transceivers) assume a normal (i.e., Gaussian) distribution for interferences and noisy channel randomness. This assumption may be based on the Law of Large Numbers and may be used because the true distributions for interferences and noisy channel randomness may be difficult to model. However, multiple access interference (MAI) may not be Gaussian noise; rather, MAI may be reshaped by the ED's physical layer transmitter. Accordingly, when a Gaussian distribution is used to model MAI, the result is that two neighboring signal manifolds may be spaced farther apart than actually necessary. Further, heavy computation may be required on the mean vector and covariance matrix (e.g., using singular-value decomposition (SVD) or its inverse). If the mean vector and covariance matrix are difficult to be estimated, some interference cancellation receiving algorithm may be used to remove the interference, typically at a high time and/or resource cost.

Machine learning and artificial intelligence approaches have been used for solving many difficult and complex problems. However, it is generally not straightforward to apply machine learning or artificial intelligence to the challenge of designing an air interface for a target manifold. This may be because a successful deep neural network, for example a convolutional neural network (CNN), is usually used to extract features and perform classification from a higher dimensional space to a lower dimensional space; whereas, a typical wireless communication transmitter serves to extend the signal space from a lower dimensional space to a higher dimensional space. This difficulty may also be because AI technology typically is more concerned with a generative result (i.e., from lower dimensional space to a higher dimensional space) than generative procedure (i.e., step by step), whereas a wireless communication transmitter typically defines a parameterized generative procedure.

In various examples, the present disclosure describes a polarization-based approach for signal space mapping. Examples of polarization stream architecture are described, which may be used to shape a signal into a target manifold in a given multi-dimensional signal space. The polarization stream may be implemented in a receiver (or decoder), and the inverted (or reversed) polarization stream may be implemented in a transmitter (or encoder). The reverse polarization stream alters the likelihood distribution of an input signal (e.g., a block of QAM symbols or a block of information bits in a time domain) in one signal space into a targeted distribution in another signal space; the polarization stream recovers the signal from the targeted manifold (which may have added noise). In theory, neither the polarization stream nor the reversed polarization stream can actually change the dimension of the signal space and overall likelihood in this signal space. Each polarization step (or reverse polarization step) moves the likelihoods on some dimension(s) to other(s). After a cascade of polarization steps, some dimension(s) would have much higher likelihood and other dimension(s) would have nearly zero likelihood (i.e., the probability that there is signal energy on these other dimension(s) is close to zero). In a strict sense, a receiver polarization stream that inputs the target signal in a higher dimensional signal space and outputs the source signal in a lower dimensional signal space is doing the polarization because of dimensional reduction (those dimensions with close zero likelihood are dismissed or reduced). The example polarization stream architecture may enable the use of a machine learning approach, as discussed further below.

To assist in understanding the present disclosure, some background discussion of machine learning is now provided. A neural network, which is a form of machine learning, may be considered as a type of fitting function. Deep learning is one realization of a neural network, which contains more than one interconnected layer of artificial neurons. To train a deep neural network to fit a function (e.g., training using a great amount of input samples and output samples), the weight and threshold of each neuron are updated iteratively, so as to minimize an overall loss function or maximize an overall reward function. The iteration may be achieved by a gradient-descent or ascent back-propagation algorithm over training samples, which may require that the deep neural network architecture and the loss or reward function be mathematically differentiable.

Trainability typically requires: a function set (the neural network architecture) that defines an exploration space boundary within which a gradient-descent algorithm may traverse; and one or more loss (or reward) function(s) being differentiable with respect to each neuron's coefficient (for gradient-ascent or descent training) on that neural network architecture.

A deep neural network is often used for performing feature capture, and for performing prediction. Feature capture serves to extract useful information from a number of complex data, and this may be considered a form of dimension reduction. Prediction involves interpolation or extrapolation, to generate new data (generally referred to as predicted or estimated data) from sample data. Both these tasks may assume that the input data possess an intrinsic autoregression characteristic. For example, a pixel of an image usually has some relationship with its neighboring pixels. A convolutional neural network (CNN) may be developed to use this relationship to reduce the dimension of the data. In contrast, random independent noise data provides no useful relationship for a deep neural network. Hence, a challenge in applying a deep neural network to a wireless transmitter is how to deal with an input signal that may have characteristics of independent and identically distributed (IID) random variables. Examples described herein provide a polarization-based approach to facilitate a machine learning-based solution to the transmitter or receiver adapted for a higher-dimensional signal space.

Polar encoding, as used in forward error correction solutions, is an example of polarization. Input signals (e.g., a coding block or information bits) to a polar encoder are assumed to have polarized likelihoods: some bit positions have a higher likelihood (to be decoded) and others have lower likelihood. All output signals from the polar encoder (e.g., a codeword) have equal likelihood in all positions, because they would be uniformly affected by noise an additive white Gaussian noise (AWGN) channel. Note that the polarization is from the view of a polar decoder (corresponding to a strict-sense polarization happening on a polarization-stream-receiver that reduces the dimension of the signal). Because a polar decoder uses a successive cancellation algorithm, the information bits (which are the bits to be decoded) have different likelihood distributions. For a convolutional code, because its decoder uses a convolutional decoder, the information bits have equal likelihood distribution. In this sense, both the input and output of a convolutional code have equal likelihood distributions.

Conceptually, a polar encoder serves to alter the likelihoods from its input (polarized distribution) to its output (equal or uniform distribution) from the perspective of a successive cancellation decoder. In this sense, the polar encoder is a de-polarization procedure in order to extend the dimensionality of the signal. In fact, a polar code introduces a one-directional conditional probabilities cascade on the output signals (e.g., codeword). If all the input signals have equal likelihood, the output signals would not have uniform likelihood. In order to have a uniform likelihood on the output, the input signals should not have equal likelihood, that is, the input signals should have polarization. This is the principle to develop a density evolution algorithm (e.g., a successive cancellation-based decoding algorithm) to compute the input signals' likelihood distribution backward from an output whose likelihood distribution, in a polar code, are assumed to equal one. Based on the computed input signal likelihood distribution, the information bits are allocated to the bit positions with greatest likelihood and frozen bits are allocated to the bit positions with the least likelihood.

Figure 4:
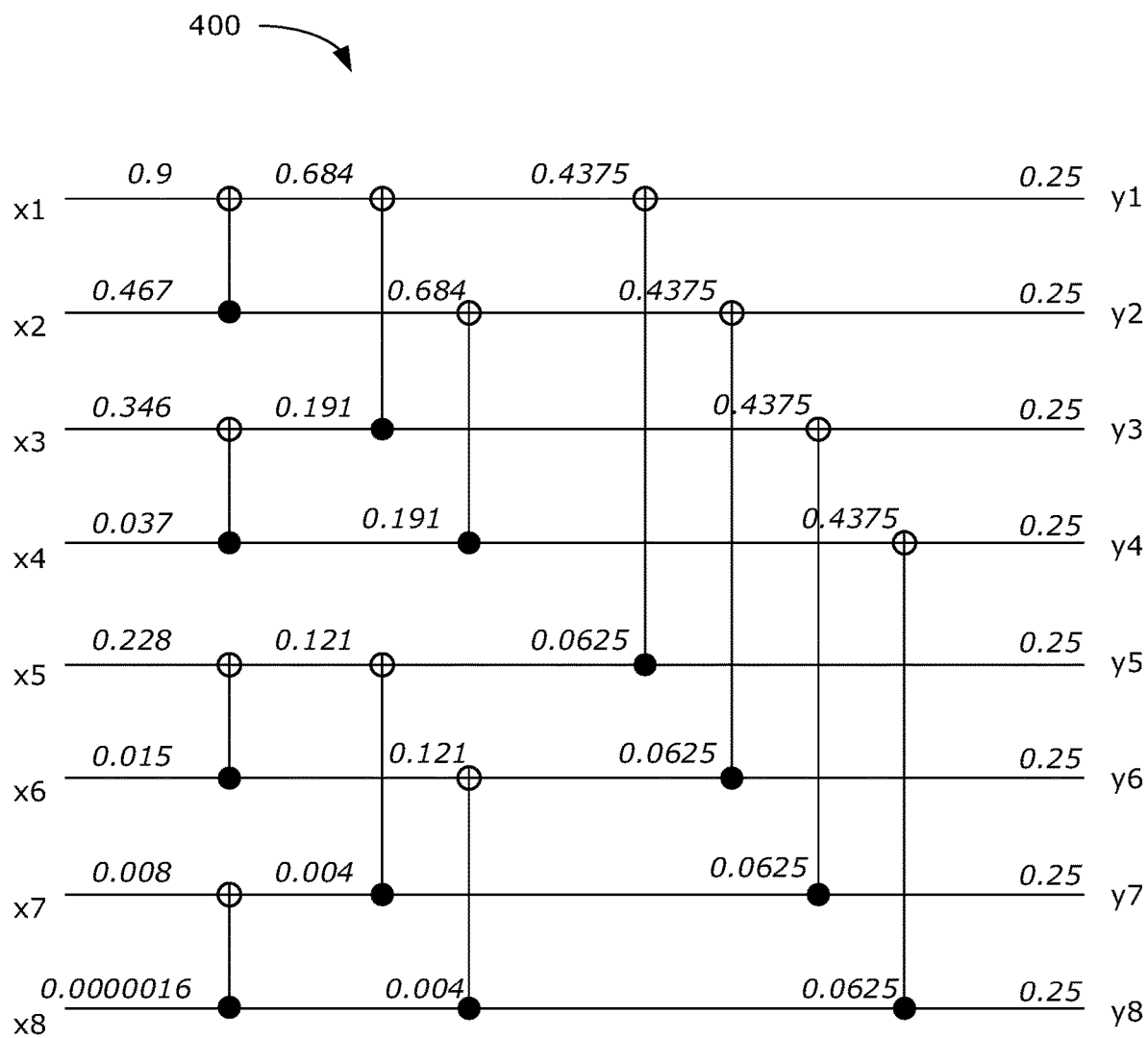
FIG. 4 is a representation of an example three-step polar encoder.

FIG. 4 is a schematic diagram illustrating an example of a three-step polar encoder 400. The encoder 400 receives as input a set of signals x=<x1, x2, . . . x8> having a polarized likelihood distribution (indicated by superimposed numbers in FIG. 4). x has bit positions with higher likelihood (e.g., bit positions x1, x2 and x3), which may be used to carry information bits, and bit positions with lower likelihood (e.g., bit positions x4, x5, x6, x7 and x8) which may be used to carry frozen bits. As the input signals are cascaded through the encoder 400, the probabilities are changed, such that the set of output signals y=<y1, y2, . . . y8> has a uniform likelihood distribution. The polar encoder 400 may be based on a polarization kernel 410, for example an Arikan kernel which is represented schematically in FIG. 5. The polarization kernel 410 may be represented as the generator matrix $G_2$ 420. The encoder 400 of FIG. 4 may thus be arrived at using the three-fold matrix $G_2 \otimes^3$ 430. The codeword y may be formed by the product of the input x and the three-fold matrix $G_2 \otimes^3$ 430.

As illustrated by the polarization kernel 410, polarization doesn't change the overall reliability (likelihood) of the signal, but does change the likelihood distribution, because the determinant of the Jacobian matrix [1 0; 1 1] of its generator matrix $G_2$ 420 is 1.

The above discussion demonstrates that polarization (e.g., using a polar code) can shape the likelihood distribution from an input to a target output, in a multiple-dimensional signal space.

As noted above, the reason the codeword is assumed to be equally distributed is due to assuming an AWGN channel that adds white noise on every codeword bit or symbol equally. This typically has been an important assumption in the wireless domain. However, in theory, the codeword may be assumed to have any arbitrary distribution, from which the density evolution algorithm may compute the correspondent input distribution.

In examples described herein, the target likelihood distribution may be non-uniform. Generally, the target likelihood distribution (which may be determined beforehand) may be in any target multiple-dimensional (also referred to as x-dimensional or x-D, where x may be greater than 2) signal space. For simplicity, the present discussion will be based on an example where the input source likelihood distribution is a random variable (e.g., following QAM modulation IID distribution, or directly 0 and 1 or −1 and +1 Bernoulli distribution) along the time dimension. A deep (that is, having multiple layers or multiple steps) reverse polarization stream architecture may be implemented in a transmitter, to shape the input having a block of signals, each of which follows source likelihood distribution, filled by a number of zeros up to x-D to a targeted x-D distribution, without changing the total likelihood distribution.

In some examples, the deep reverse polarization stream architecture disclosed herein enables shaping of the output to fit any target likelihood distribution (also referred to as a manifold), more than the shaping available using just a polar code. For example, the deep reverse polarization stream architecture disclosed herein may provide not only shifting of the signal distribution, but also scaling of the signals at each reverse polarization step. This may enable shaping of the output into a discontinuous distribution (e.g., having a "two moons" shape), which may be difficult or impossible using shift-only-driven polarization (as in the case of a polar encoder). Further, the deep reverse polarization stream architecture disclosed herein is an invertible architecture. This may enable implementation of a deep polarization stream architecture at the receiver or decoder (where the deep polarization stream architecture is simply an inverse version (opposite) of the deep reverse polarization stream at the transmitter or encoder), to recover or decode the source likelihood distribution of the signal in the regular signal domain.

Given a target manifold and input source likelihood distribution (e.g., having IID random, normal or Bernoulli distribution, which may be typical in wireless communications), the deep polarization stream architecture disclosed herein is trainable for machine learning purposes. As illustrated above, the polarization generator matrix $G_2$ at each step in the polarization stream is a lower (or upper) triangular matrix, and the determinant of its Jacobian matrix is summation of the diagonal elements. If the determinant is differentiable at each step, a gradient-descent or -ascent back-propagation algorithm can be used for training on this polarization stream architecture or its reversed one.

In the present disclosure, the deep polarization stream architecture includes a cascade of polarization steps. "Deep" may therefore mean that there are multiple such polarization steps in the stream. At each polarization step, the input signals are divided into two groups (or two subsets). One group of the signals is left intact and copied directly to the output, this group may be referred to as the systematic group (or systematic subset). The other group of the signals is shifted (and optionally scaled as discussed further below) and outputted, this group may be referred to as the coded group (or coded subset). In the example kernel 410 of FIG. 5, x2 represents the systemic group and x1 represents the coded group. It should be understood that the systemic group and the coded group may each contain any number of signals (or information), the systemic group and coded group do not overlap (i.e., do not share any common signals or information), and the systemic group and coded group together cover the entire input signal. The systemic group and coded group may be equal in size (i.e., each having an equal number of bits), or may be unequal in size. Shifting and scaling at each polarization step may be performed by applying a shifting vector and scaling vector, respectively, to the input. The example kernel 410 shows an example in which the shifting and scaling vectors are 1 (in effect, there is a shift of 1 and no scaling). The shifting vector and/or the scaling vector may be fixed, or may be functions. For example, the scaling and shifting vectors over the coded group may be functions of the signals (or information) in the systematic group.

As will be discussed further below, machine learning (e.g., a deep neural network, such as a deep convolutional network) may be used to provide the functions for generating the scaling and shifting vectors. The architecture and coefficients of the deep neural network may be dependent on the source and target signal likelihood distributions. For example, the architecture and tables of the coefficient values may be defined in a standard.

Each polarization step may be expressed as the multiplication of an input signal vector (e.g., bits, real valued, or complex-valued vector) multiplied by a polarization generator matrix (e.g., bit, real valued, or complex-valued matrix) that must be upper-triangular or lower-triangular. The absolute value of the determinant of the Jacobian matrix of the generator matrix should be 1 in order not to increase or decrease the overall likelihood from the input to the output of this polarization step. In other words, polarization changes the likelihood distribution by redistributing the likelihood among the different positions in a multiple dimensional space, without increasing or decreasing the total overall likelihood. The polarization step increases the likelihood on one position by a causing a corresponding decrease in likelihood at another position in a signal space, rather than by adding extra likelihood into the signal. As a property of the triangular matrix, the determinant is the sum of the diagonal elements of the Jacobian matrix of the generator matrix.

The polarization may be converted into the log domain so that the multiplications become additions. Accordingly, the log domain determinant is the summation of the log-domain diagonal elements of the Jacobian matrix of the generator matrix of the polarization, whose absolute value (in the log domain) should be 0.

A well-designed receiver or a decoder should recover the likelihood measurements of the target signals (usually with added noise) back to the likelihood measurements of the source distribution. Because the polarization generator matrix (which is a triangular) at each step is invertible, the overall deep polarization stream is invertible. A receiver or decoder may multiply the received signal vector by the inverse or reciprocals of the scalar and shift vectors at each depolarization step. Accordingly, using a suitably designed generator matrix, the depolarization steps may be obtained using the same neural networks as those used for generating the polarization steps. In some examples, if the deep reverse polarization stream (used at the transmitter) is known (e.g., known function set, weights and thresholds of the neurons) to a receiver, the receiver may reverse the deep reverse depolarization stream into a deep polarization stream, to recover the source signal. In some examples, the receiver may also apply a receiving algorithm such as expectation propagation algorithm (EPA). In the log domain, the scaling function defines the exponent scalar factor vector. Accordingly, the traditional EPA receiver may also operate in the log domain so that the multiplication becomes addition and division becomes subtraction.

Using the disclosed polarization-based machine learning-assisted approach, the challenges of waveform design and optimization may be approached as a problem of how to appropriately train a cascade of polarization neural network. This will be discussed further below. Large-dimensional complex problems, such as problems found in MIMO pairing and non-orthogonal multiple access (NoMA) grouping/multiplexing (conventionally requiring solving a large-dimensional optimization problem with Gaussian assumption) may be approached as neural network training problems, which may be more manageable.

In examples described herein, there may be no need to assume a Gaussian distribution in solving an optimization problem. In some cases, a large problem may be divided into smaller problems, based on the nature of the neural network. A problem that may be very complex and non-linear (and possibly computationally impossible to solve in practice) using conventional (e.g., heuristic) methods may become feasible using the neural network-based approach described herein.

To assist in understanding the present disclosure, a discussion of manifolds is now provided. A number of blocks of signals may be considered to form a likelihood distribution in a signal space. In wireless terms, a likelihood distribution indicates how likely the information encoded at one position of a signal space can be recovered by the decoder. From this point of view, a communication physical layer transmitter, wired or wireless, shapes a source likelihood distribution (e.g., having a uniform distribution from 0~1 or a QAM uniform distribution) to a target likelihood distribution. The target likelihood distribution is known to both the transmitter and receiver, but the source likelihood distribution typically is not known to the receiver. The dimensions of the source and target distributions may not be the same.

When signals are transmitted over the air, the signals propagate along all the dimensions, such as time, frequency, space, code and others. Some dimensions may be well-understood and other dimensions may not be. Some dimensions may be capable of being heuristically represented (such as time and frequency) and others may not be capable of heuristic representation. Some dimensions may not be fully observable and understood using available technology. The most accurate representation of a signal (or the "true" signal) may therefore require a high-dimensional signal space. A transceiver serves to project a high-dimensional signal onto a lower dimensional sub-signal space (referred to as a signal space for simplicity). This projection to a lower dimensional signal space is due to the limitations of available observation apparatus. In this sense, the waveform in a wireless field, which is a set of blocks of signals, may be considered to be a low-dimensional manifold of a high-dimensional actual signal space. In the present disclosure, for simplicity, a signal sub-space may be referred to as a signal space or a multiple-dimensional signal space, and the terms manifold and likelihood distribution may be used interchangeably As previously discussed, developments in the wireless physical air interface have been in two directions, namely the introduction of new dimensions into the signal space, and the enhancement of resolution on the existing signal space.

The introduction of a new dimension into the signal space provides a dimensional gain or diversity gain. For example, the development of CDMA technology introduced the code dimension; the development of MIMO technology introduced the antenna space dimension; and the development of CoMP/dual connectivity introduced the geographic space dimension. Dimensional gain is used to increase system capacity and is a feature of the evolution of a wireless system from one generation to the next.

The enhancement of resolution on the existing signal space enables more efficient usage of the signal space. From the perspective of a radio scheduler, a signal space is a radio resource pool for a wireless system that serves multiple users simultaneously. Higher resolution enables a finer scheduling algorithm and higher efficiency. For example, in the evolution of 2G FDMA to 4G OFDMA, the sub-carrier spacing was reduced (by enabling a receiver that separates two overlapping but orthogonal neighbor sub-carriers), enabling 4G wireless technology to have higher spectrum efficiency than 2G. In general, spectrum efficiency may be improved at the cost of receiving complexity. If a waveform of one user is considered as one manifold in a signal space, a higher resolution offers more flexibility to juxtapose multiple manifolds (i.e., from multiple users) without unacceptable interference in this common signal space. Hence, achieving a higher resolution is also a feature of the evolution of a wireless system from one generation to the next.

The two directions of development discussed above have been so far among the most effective ways to improve system capacity. However, there may be drawbacks.

In adding new dimensions, the addition of each new dimension has been more challenging. For example, in 2G wireless technology, the timing and frequency dimensions are linear and orthogonal, enabling an orthonormal 2D signal space (called radio frequency-time frame structure and numerology) where multiplexed signals may be separated in a relatively straightforward manner. It was relatively straightforward to handle issues that could impact orthogonality, such as frequency shift and time offset due to channel distortion. For 3G wireless technology, the code dimension was introduced as a linear and quasi-orthogonal dimension. The result was an orthonormal 3D signal space (together with the timing and frequency dimensions). However, the orthogonality of the code dimension is dependent on the codes and powers on the codes, and may be vulnerable to the time-varying radio channel. Thus, a power control mechanism and sophisticated timing advance mechanism were required in 3G to align multiplexed signals in a common signal space. In MIMO wireless technology, the space dimension was introduced. Orthogonality of the space dimension is dependent on the time-varying correlation or similarity of antennas. A receiver's measurement is important for a MIMO system to appropriately adjust powers and angles and timing of a transmission antenna set, in order to form an orthonormal multi-dimensional signal space when the signals arrive at the receivers. Generally, it should be appreciated that future dimensions that may become introduced are likely to be less linear (or even non-linear), less orthonormal and/or more vulnerable to channel distortion. This may require significant system resources and complexity, such as a need for more measurement, feedback, scheduling and/or decoding complexity in order to orthogonalize or regularize such new dimensions.

Any increase in resolution may also be challenging. In general, higher resolution may be expected to result in higher spectrum efficiency. However, such advantages may not be fully realized, due to different types of receiver and channel conditions. A wide scale of resolutions may be used along the different dimensions, depending on different application purposes and environments. For example, in 5G NR technology, there are varying sub-carrier spacings and TTIs.

Generally, a wireless transmitter serves to define a (conventionally deterministic and parameterized) method to shape a one-dimensional (usually in the time dimension) source likelihood distribution (that is, a block of information bits or modulated symbols) into a targeted likelihood distribution (also referred to as a manifold) in a specific D-dimensional signal space for a specific user. Given a targeted x-dimensional manifold (which may contain non-linear and less orthonormal dimensions, and of varying resolution), the present disclosure describes examples in which machine learning technology may be used to help design an autonomous shaping function that is invertible for a receiver to recover or decode the source likelihood distribution from a x-D dimensional target manifold (which may include noise).

Shaping of a likelihood distribution is now discussed. Consider a shaping function that serves to shape a 1D source signal X to a 1D target signal Y. $Z_x$ is the likelihood distribution of the source random variable X, and $Z_y$ is the likelihood distribution of the target random variable Y. $Z_x \sim (0,1)$ is a uniform distribution. After Y is shaped from X by the shaping function $Y=\frac{1}{2} \cdot (2 \cdot X+1)$, then $\|Z_y\|^2 = \|Z_x\|^2$ and $Z_y \sim (\frac{1}{2}, 3/2)$. In this example, the shaped signal Y still has a uniform distribution $Z_y$, because the shaping function is purely linear. However, if the shaper contains non-linear operations, $Z_y$ may be no longer uniform. However, $Z_y$ may have auto-regression and may have extension/reduction of dimensionality in a sense. Auto-regression means that the likelihood distribution on some parts of Y may be related (or conditional) to others. That is, some part of Y has higher reliability than others. A source distribution may be shaped to a target distribution using a cascade of shaping functions.

In the example discussed above, the shaping function includes a scaling factor of ½. The scaling factor may also be referred to as a normalization factor. The scaling factor may serve to preserve the overall likelihood from source to target. The result is that the overall shaping function does not add or reduce the overall likelihood.

In a more general term, to preserve the overall likelihood, the normalized shaping function should satisfy the following (where X is the source distribution, and Y is the target distribution):

$$X \cdot dX = Y \cdot dY$$

$$Y = X/(dY/dX) = X/det(J(X)) = X/\text{abs}(det(J(X)))$$

where J(X) is the Jacobian matrix (dY/dX), and det(•) is the determinant.

If abs(det(J(X)))=1, then the shaping function preserves the likelihood from X to Y. It may be noted that abs(det(J(X))) of the fast Fourier transform (FFT) (which is used in OFDM modulation to shape time-domain signals into frequency-domain signals) is 1. Although in theory there exists a J(X) that satisfies the likelihood preservation criteria for any target distribution, such a J(X) may be difficult to find, and even if found may be difficult to implement in practice. In algebraic geometry terms, abs(det(J(X))) may be thought of as the change in volume when X is shaped into Y. In that sense, the preservation criteria may be thought of as keeping the overall volume unchanged.

In the present disclosure, an approach is described in which machine learning is used to help find the desired J(X) for shaping the source distribution to a given target distribution. Some previous attempts at such an approach is the use of an autoencoder. However, so far the autoencoder approach has been able to find J(X) only for a very small number of X and Y. The difficulty in using a machine learning-based approach is the fact that there is no autoregression logic in the relationship Y=X/abs(det(J(X))) and that X is assumed to have the property of IID along the time dimension in a wireless system. Thus, the correlation/regression that is needed for training a machine learning algorithm is lacking. In examples described herein, a polarization-based approach is described that creates an intrinsic regression, to enable training of a machine learning algorithm, to find J(X).

As discussed previously, a polar code is an example of reliability polarization (that is, where there is different likelihood distribution over the information bit positions). The assumption is that the output of a polar encoder (the codeword) has IID property because the output is assumed to be transmitted over an AWGN channel that adds equal noise on each dimension of the transmission. For simplicity, the input to the polar encoder will be referred to as X, and the output of the polar encoder will be referred to as Y.

In order to form an output Y having IID property, the input distribution of X cannot have IID likelihood. Rather, X is polarized, meaning that some bit positions have high likelihood and other bit positions have low likelihood. In the example shown in FIG. 4, the polar encoder 400 outputs a Y having a uniform probability distribution of 0.25, where the input X has a non-uniform probability distribution. In the example of a polar code, X and Y have the same dimension size.

Generally, if Y has a uniform likelihood distribution, then X must have a polarized likelihood distribution. Density evolution algorithm is one well-known way to deterministically compute the likelihood (i.e., reliability) of X given a uniform distribution of Y. From the perspective of the normalized shaping principle discussed above, a density evolution algorithm may be thought of as a cascade of shaping functions that convert a uniform likelihood distribution Y into a polarized distribution X.

However, it should be noted that it is unnecessary for Y to be uniformly distributed. Any form of Y distribution input into a density evolution algorithm would result in a deterministic polarized distribution X. The density evolution algorithm is based on polar code architecture. Hence, it is the polar coding architecture that shapes the likelihoods from Y to X. In some examples described herein, a polarization-based architecture is described, in which a cascade of shaping functions is used to generate a target Y (which may have any arbitrary desired likelihood distribution) from a source input X. In other words, although polar coding provides background for the present disclosure, the disclosed polar stream architecture is not necessarily limited to generating a target Y having uniform likelihood distribution.

The following is a discussion of the design of a polarization-based architecture for shaping an input to a target distribution, in accordance with examples of the present disclosure. A polar encoder may be generalized as a cascade of reverse polarization steps. Each reverse polarization step involves a generator matrix. In the example of FIGS. 4 and 5, the generator matrix $G_2$ 420 is [1 0; 1 1], which is a lower triangular matrix whose Jacobian matrix J(X)'s determinant is 1. It should be noted that the generator matrix $G_2$ 420 [1 0; 1 1] may also be expressed as [1 1; 0 1], which is an upper triangular matrix also having det(J(X))=1.

For a triangular matrix, the determinant of its Jacobian matrix is the accumulation of its diagonal elements that are all one. It should be noted that the reverse polarization step is invertible, for example:

$x2=y2$ $x1=y1 \oplus y2$ (where $\oplus$ is XOR in bit operation)

It should also be noted that the distribution of Y has a regression characteristic. This characteristic facilitates the use of a machine-learning based approach.

Figure 6:
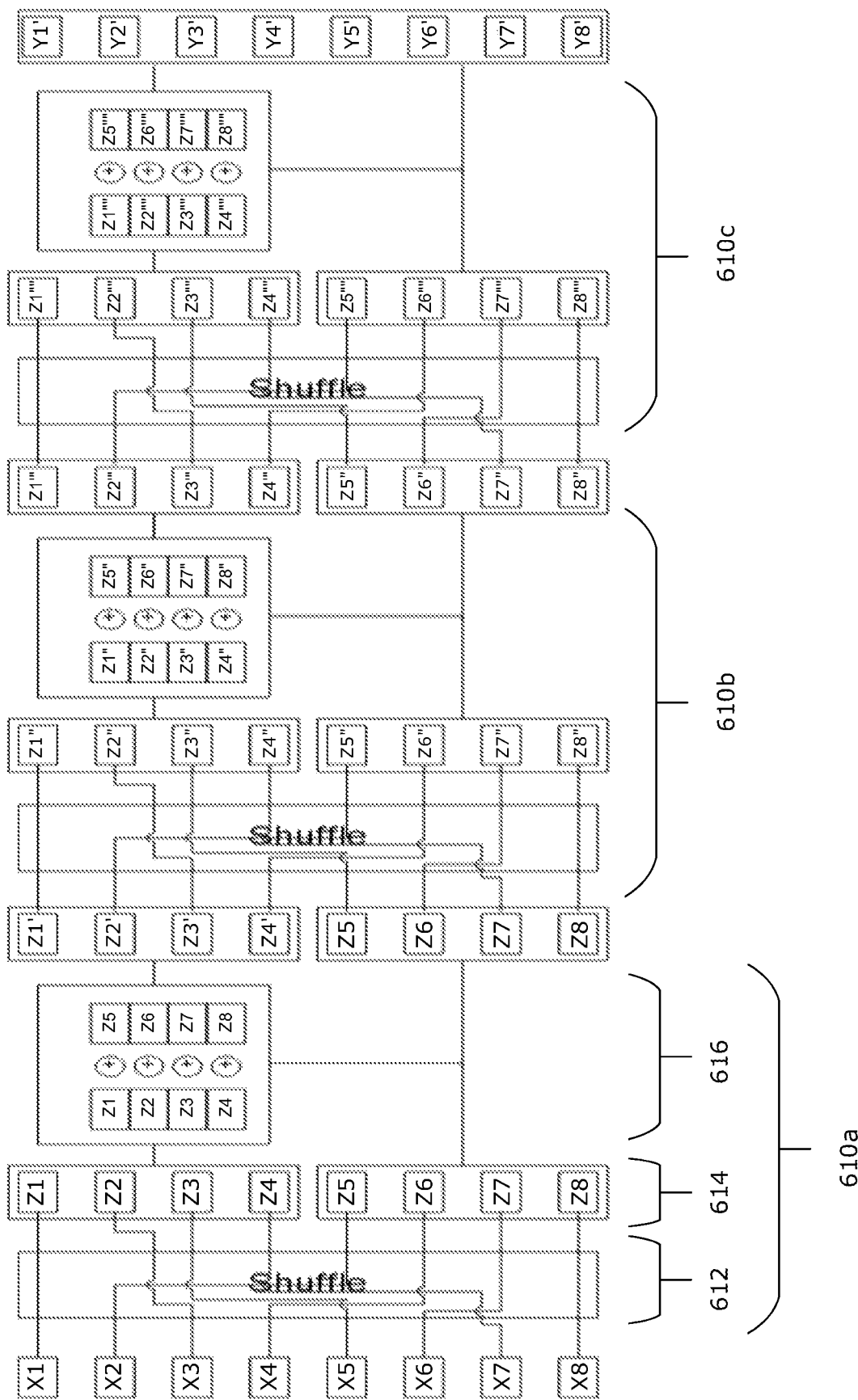
FIG. 6 is a schematic diagram illustrating an example architecture for a three-step polarization stream.

FIG. 6 is a schematic representation of the polar encoder 400 of FIG. 4. The three reverse polarization steps are represented as a cascade of three steps 610a, 610b, 610c (generally referred to as 610). For simplicity, FIG. 6 indicates the details of one step 610a, however it should be understood that each step 610 may include the same or similar operating blocks.

Figure 7:
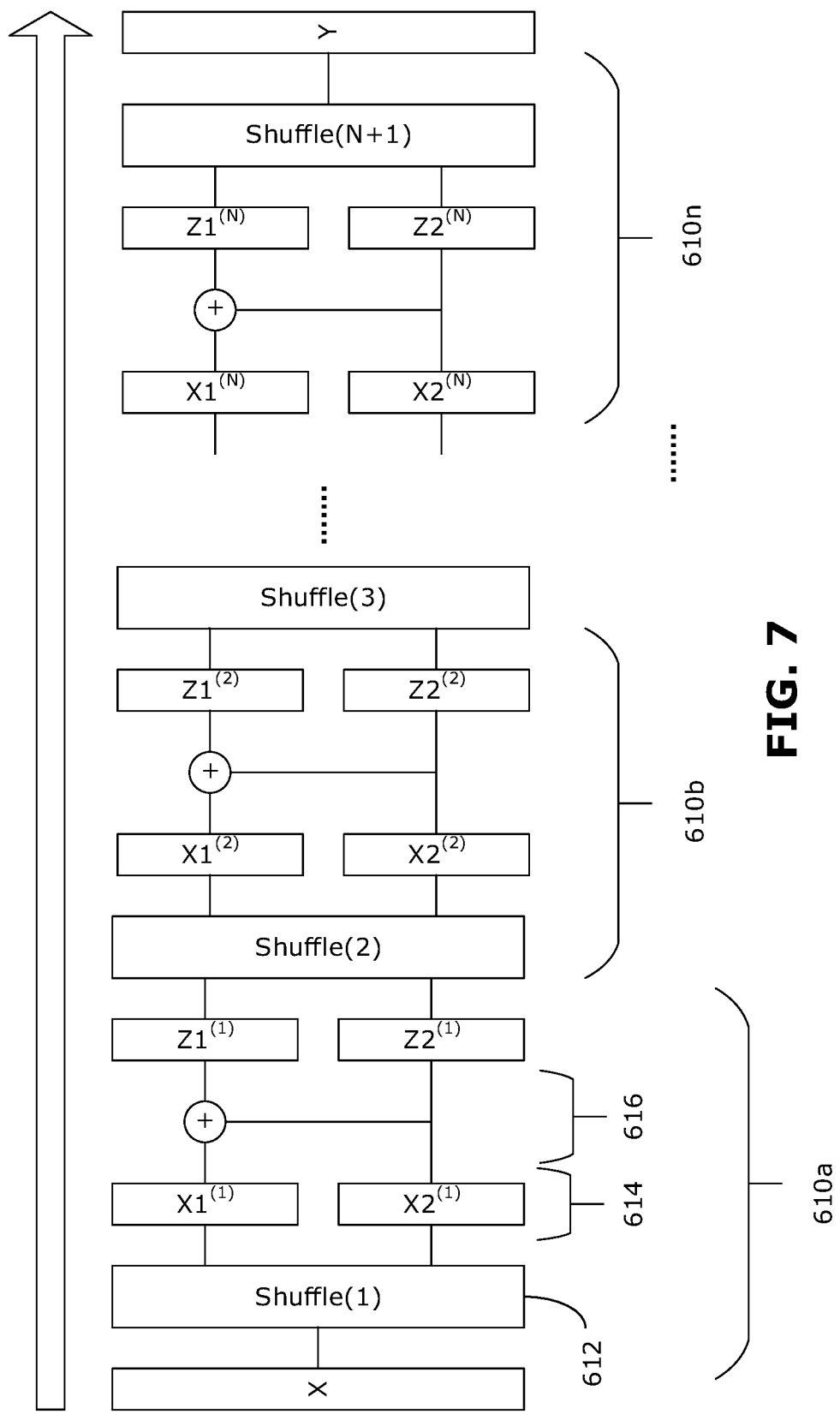
FIG. 7 is a schematic diagram illustrating an example generalized reverse polarization stream architecture.

One step 610 in the cascade includes a shuffle block 612 (which may implement any suitable shuffle method) to implement a shuffle function. The shuffle block 612 receives a set of input bits and outputs a set of shuffled bits. The step 610 also includes a split block 614 to implement a split function. The split function splits the shuffled bits into a first shuffled bit group and a second shuffled bit group. The step 610 also includes a polarization block 616 that performs polarization. In the example shown, the polarization implements the Arikan kernel. This architecture may be generalized, as shown in FIG. 7. The general architecture may apply for any type of signal; in the case of polar code, the signal is a binary one. It may be noted that, in FIG. 7, there is a shuffle(N+1) block, which does not correspond exactly to the three-step example of FIG. 6. This is because FIG. 7 is a generalized architecture for which the number of steps 610 is not fixed, and which is not specific to the polar code for N=8.

In the present figures, the symbol "+" in the polarization block 616 represents element-wise addition operation between two operand vectors (bit, real or complex). Each of the steps 610 involves:

$$\vec{Z1}^{(n)} = \vec{X1}^{(n)} + \vec{X2}^{(n)}$$

$$\vec{Z2}^{(n)} = \vec{X2}^{(n)}$$

where $\vec{X}^{(n)} = \text{shuffle}_n(\vec{Z}^{(n-1)})$

The Jacobian matrix is:

$$\frac{\partial \vec{Z}^{(n)}}{\partial \vec{X}^{(n)}} = \begin{bmatrix} I & I \\ \phi & I \end{bmatrix}$$

It should be noted that the determinant of this Jacobian matrix is 1, because all of its diagonal elements are one. Thus, each step 610 preserves the overall likelihood of the source distribution X but alters the distribution to generate the target distribution Y.

The overall shaping procedure (from source distribution X to target distribution Y) may be written as:

$$X = X^{(1)}(Z^{(0)}) \leftrightarrow Z^{(1)} \leftrightarrow Z^{(2)} \leftrightarrow Z^{(3)} \ldots \leftrightarrow Z^{(N)} = Y$$

The overall Jacobian matrix of J(X) thus is:

$$\frac{\partial \vec{Y}}{\partial \vec{X}} = \frac{\partial \vec{Z}^{(N)}}{\partial \vec{X}^{(1)}} = \frac{\partial \vec{Z}^{(N)}}{\partial \vec{X}^{(N)}} \cdot \frac{\partial \vec{X}^{(N)}}{\partial \vec{Z}^{(N-1)}} \cdot \frac{\partial \vec{Z}^{(N-1)}}{\partial \vec{X}^{(N-1)}} \cdots \frac{\partial \vec{Z}^{(1)}}{\partial \vec{X}^{(1)}} = \prod_{n=1}^{N} \left( \frac{\partial \vec{Z}^{(n)}}{\partial \vec{X}^{(n)}} \cdot \frac{\partial \vec{X}^{(n)}}{\partial \vec{Z}^{(n-1)}} \right)$$

Because of the characteristics of polar code, the determinant of the Jacobian of the shuffle is:

$$\left|\frac{\partial \vec{X}^{(n)}}{\partial \vec{Z}^{(n-1)}}\right| = 1$$

Then, the total determinant is:

$$\det\left(\frac{\partial \vec{Y}}{\partial \vec{X}}\right) = \prod_{n=1}^{N}\left(\det\left[\frac{\partial \vec{Z}^{(n)}}{\partial \vec{X}^{(n)}}\right] \cdot \det\left[\frac{\partial \vec{X}^{(n)}}{\partial \vec{Z}^{(n-1)}}\right]\right) = 1$$

In the present disclosure, the shaping procedure (i.e., the procedure $X=X^{(1)}(Z^{(0)}) \leftrightarrow Z^{(1)} \leftrightarrow Z^{(2)} \leftrightarrow Z^{(3)} \ldots \leftrightarrow Z^{(N)}=Y$) may be referred to as the "reverse polarization stream", the "polar g-stream" or "g-function". The architecture that enables this reverse polarization stream is referred to herein as the g-network. The g-network, shown in FIG. 7, processes the signal from a source distribution X to a target distribution Y, as indicated by the forward arrow in FIG. 7. The reverse polarization stream is invertible, and its inverse may be referred to as the "polarization stream", "polar f-stream" or "f-function". The polarization stream may be represented as:

$$\vec{X1}^{(n)} = \vec{Z1}^{(n)} - \vec{Z2}^{(n)}$$

$$\vec{X2}^{(n)} = \vec{Z2}^{(n)}$$

where $\vec{Z}^{(n-1)} = \text{shuffle}_n^{-1}(\vec{X}^{(n)})$

Figure 8:
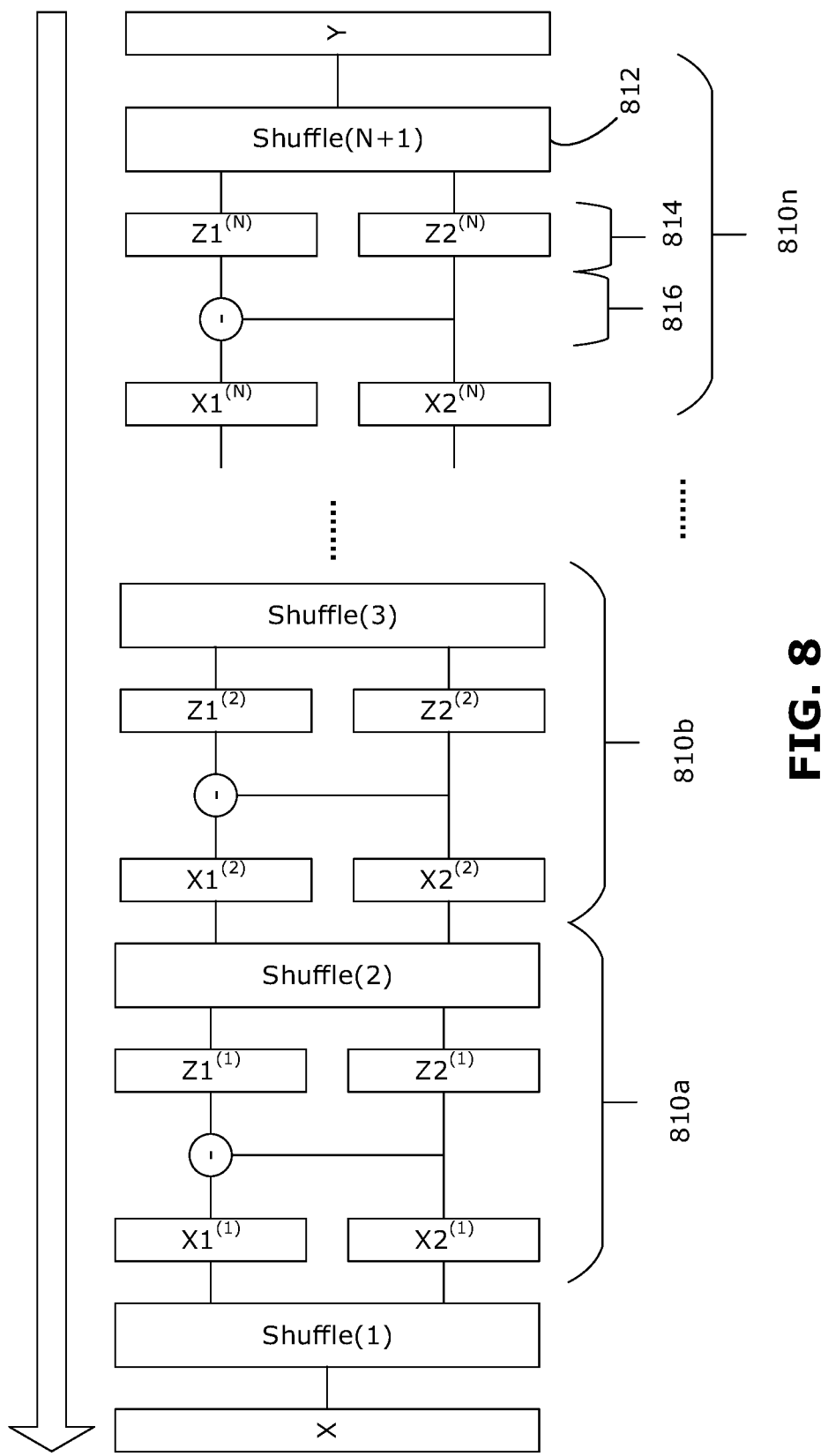
FIG. 8 is a schematic diagram illustrating an example generalized polarization stream architecture.

FIG. 8 shows a generalized polarization architecture. The polarization architecture includes a cascade of polarization steps 810a to 810n (generally referred to as step 810), inverting the operations of the reverse polarization stream shown in FIG. 7. Each step 810 includes a shuffle block 812, a splitter block 814 and a polarization block 816. In the present figures, the symbol "-" in the polarization block 816 represents element-wise subtraction operation between two operand vectors (bit, real or complex). The architecture that enables the polarization stream is referred to herein as the f-network. The f-network, shown in FIG. 8, processes the signal from a target distribution Y back to the original source distribution X, as indicated by the reverse arrow in FIG. 8.

The above is a general description of the f-network and g-network, which are inverse to each other. The f-network and g-network serve to shape the likelihood distribution of Y to X and X to Y, respectively. Thus, given a distribution of output Y and a number of the shuffling functions, the likelihood distribution of X can be determined. Based on that, a polar code may be constructed and its decoding algorithm may be deduced.

This concept may be expanded beyond a polar code, for greater flexibility and broader applicability.

From the perspective of a polar code (e.g., Arikan kernel), the number of the polarization steps and the shuffle function at each step are fixed by the dimension size of X and Y, because the overall generator matrix is the Knonecker product of the Arikan kernel (e.g., as shown in FIG. 5). For example, if a dimension size is 64 ($=2^6$), then there are 6 polarization steps and 6 shuffle functions. The larger dimension size is, the deeper polarization becomes, the more polarization degree is achieved (which may lead to more channel capacity). According to Arikan's proof, when the dimension size goes to infinity, the polarization degree can be high enough to reach Shannon channel capacity limit. An alternative explanation would be that large dimension size of a signal space results in a high resolution for "moving" reliabilities from one place to another. In the polar code architecture described thus far, the number of the polarization steps is fixed, as well as the shuffle functions and polarization kernel by the dimension of the signal space. The following describes further developments that enable greater flexibility.

Figure 9:
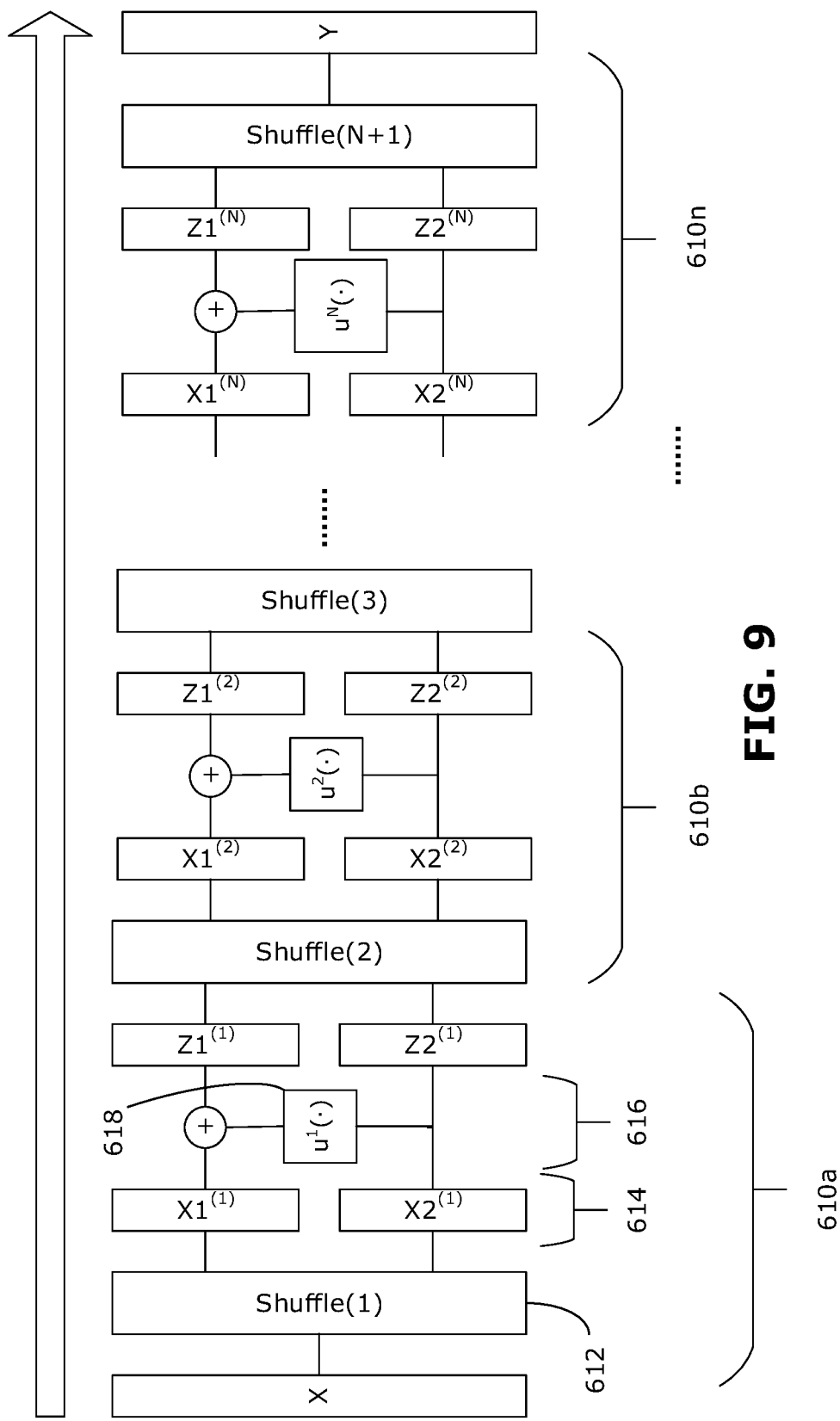
FIG. 9 is a schematic diagram illustrating an example generalized offset reverse polarization stream architecture.

FIG. 9 is a schematic diagram of a g-network that includes an offset. The architecture shown in FIG. 9 may be referred to as a reverse offset polarization stream network. Compared to the g-network shown in FIG. 7, the g-network of FIG. 9 includes an offset function u(•) 618 to the polarization block 616. It should be noted that the same offset function u(•) 618 is used in each step 610. (In theory, each step can have its own offset function u(•), but at the cost of consistency and simplicity.) With the inclusion of the offset function 618, each step 610 becomes:

$$\vec{Z1}^{(n)} = \vec{X1}^{(n)} + u(\vec{X2}^{(n)})$$

$$\vec{Z2}^{(n)} = \vec{X2}^{(n)}$$

$$\vec{X}^{(n)} = \text{shuffle}_n(\vec{Z}^{(n-1)})$$

In this example, the offset function $u^{(n)}()$ is a vector in and vector out function. The Jacobian matrix therefore is:

$$\frac{\partial \vec{Z}^{(n)}}{\partial \vec{X}^{(n)}} = \begin{bmatrix} I & \frac{\delta u^{(n)}}{\delta \vec{X2}^{(n)}} \\ \phi & I \end{bmatrix}$$

Because the Jacobian matrix is still an upper-triangular matrix, the determinant depends on the diagonal elements only, which is still 1. Therefore, the overall likelihood is still preserved. The introduction of the offset function 618 enables greater flexibility to shape the Y and X distributions conversion by manipulating the offset function u″(•) 618.

Figure 10:
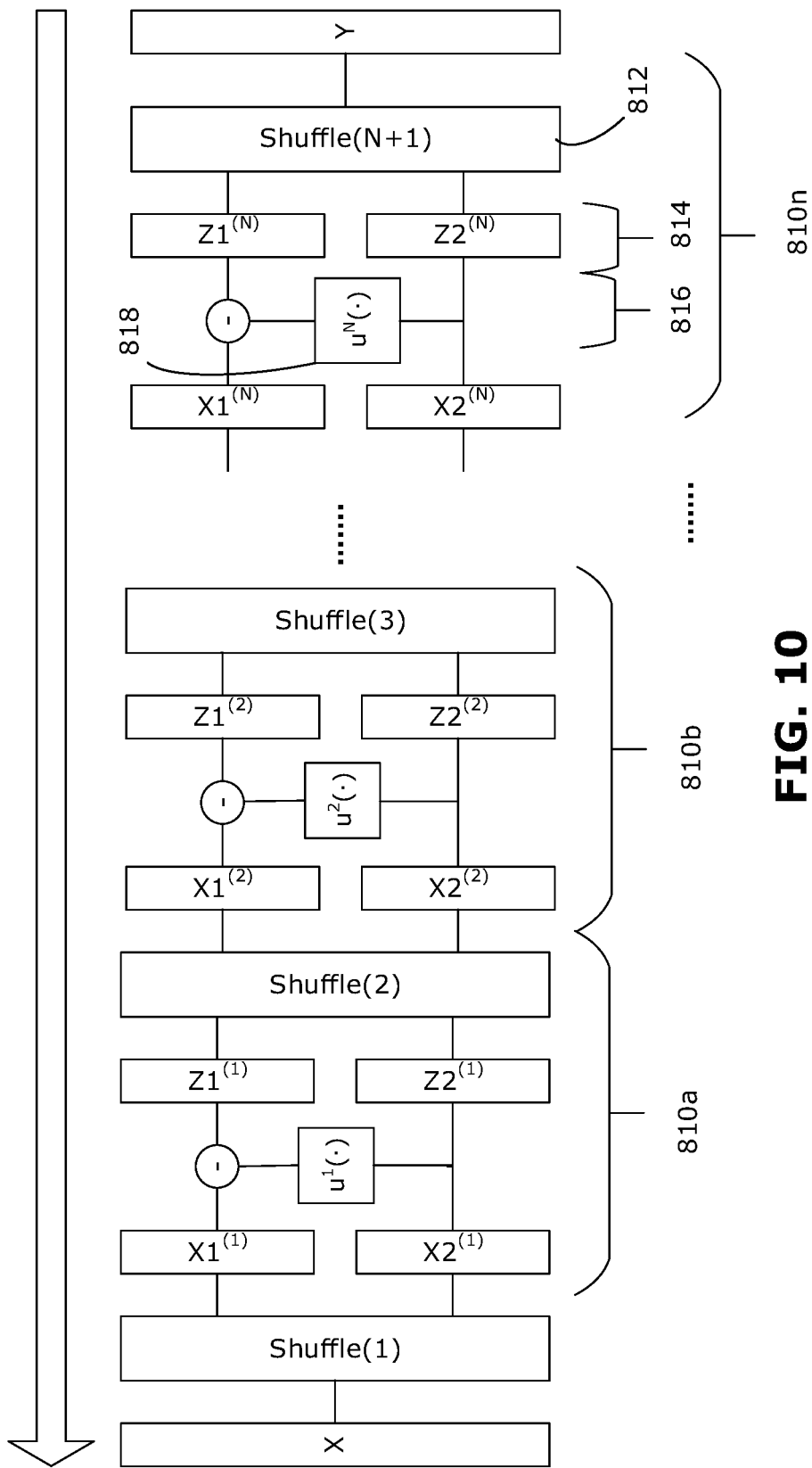
FIG. 10 is a schematic diagram illustrating an example generalized offset polarization stream architecture.

FIG. 10 shows the corresponding offset polarization stream f-network. The architecture shown in FIG. 10, when compared to the architecture of FIG. 8, introduces the offset function u(•) 818 to the polarization block 816. It should be noted that the offset function u″(•) 818 is the same between the g-network and the f-network.

Figure 11:
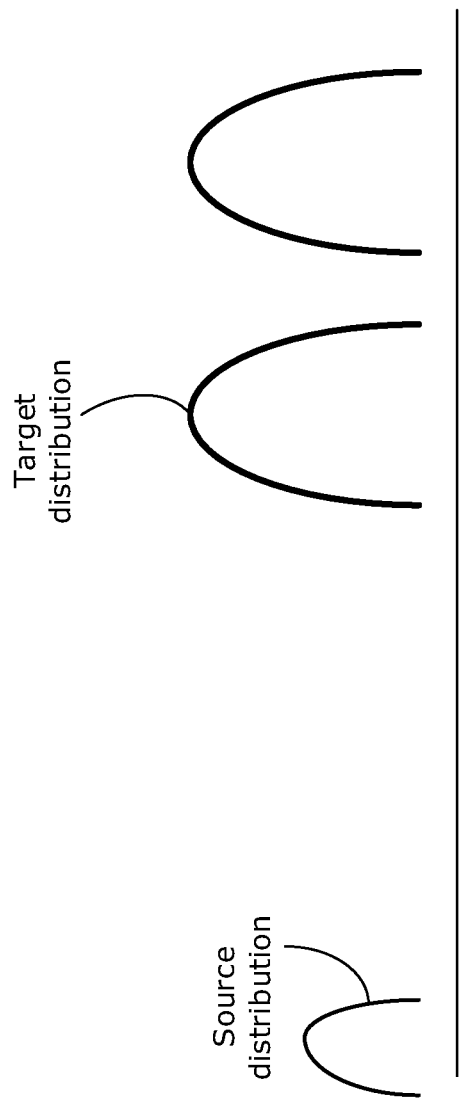
FIG. 11 illustrates an example of a double-moon target signal likelihood distribution.

As discussed above, the introduction of the offset function u(•) enables greater flexibility for shaping X to a desired target Y distribution, that is, the polarization shaping speeds up. The offset function u(•) enables the offset or shifting to achieve the target Y distribution. However, if the target Y distribution has a double moon shape (e.g., see FIG. 11), the addition of the offset function u(•) may not be sufficient. Further, in the case where low-dimensional distribution of X is converted to high-dimensional distribution of Y, the conversion efficiency of the offset may be limited. The addition of a scaling function may address such concerns.

Figure 12:
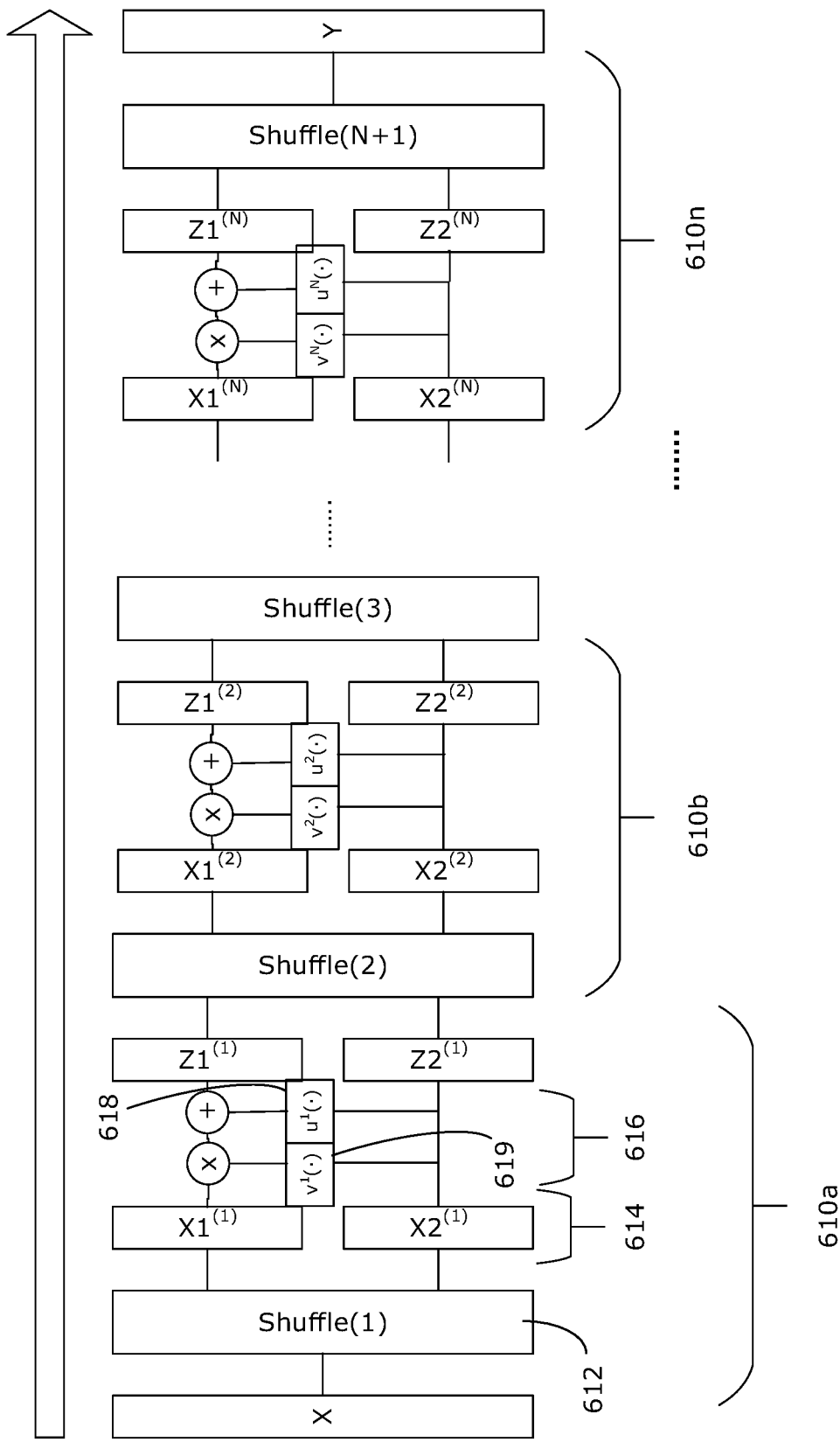
FIG. 12 is a schematic diagram illustrating an example generalized scaled offset reverse polarization stream architecture, also referred to herein as a g-network.

FIG. 12 is a schematic diagram of a g-network that includes an offset function, and further includes a scaling function. The architecture shown in FIG. 12 may be referred to as a reverse scaled offset polarization stream network. Compared to the g-network shown in FIG. 9, the g-network of FIG. 12 further includes a scaling function v(•) 619 to the polarization block 616. It should be noted that the same scaling function v(•) 619 is used in each step 610. With the inclusion of the scaling function 619, each step 610 becomes:

$\vec{Z1}^{(n)} = \vec{X1}^{(n)} \times v(\vec{X2}^{(n)}) + u(\vec{X2}^{(n)})$ $\vec{Z2}^{(n)} = \vec{X2}^{(n)}$ $\vec{X}^{(n)} = \text{shuffle}_n(\vec{Z}^{(n-1)})$ where the × operator is a dot-wise (or more generally element-wise) multiplication. Thus, each step 610 shuffles the input information or signals (e.g., real-valued signals, complex-valued signals or bits), and splits the shuffled information or signals into two information groups namely $\vec{X1}$ (first information group) and $\vec{X2}$ (second information group). In general, the present disclosure refers to "information", which may be signals (real or complex) or bits, among other possibilities. In the specific case of polar code, the information is in the form of bits. The scaling function v(•) 619 is applied to the second information group to generate a scaling vector (v($\vec{X2}$)), and the offset function u(•) 618 is applied to the second information group to generate an offset vector (u($\vec{X2}$)). Both the scaling vector and the offset vector have dimension size equal to the first information group. The output of the step 610 is formed from $\vec{Z1}$ (first output information group) and $\vec{Z2}$ (second output information group). The second output information group is a copy of the second information group $\vec{X2}$. The first output information group is obtained by element-wise multiplying the first information group with the scaling vector, then element-wise adding the offset vector.

With the introduction of the scaling function v(•) 619, the Jacobian matrix at each step 610 is:

$$\frac{\partial \vec{Z}^{(n)}}{\partial \vec{X}^{(n)}} = \begin{pmatrix} I & \frac{\delta u^{(n)}}{\delta \vec{X2}^{(n)}} \\ \emptyset & \text{diag}(v^{(n)}) \end{pmatrix}$$

The overall determinant for the g-network is $\prod_{n=1}^{N} v^n$. The resultant Y may be divided by $\prod_{n=1}^{N} v^n$ so that the total likelihood is preserved.

Figure 13:
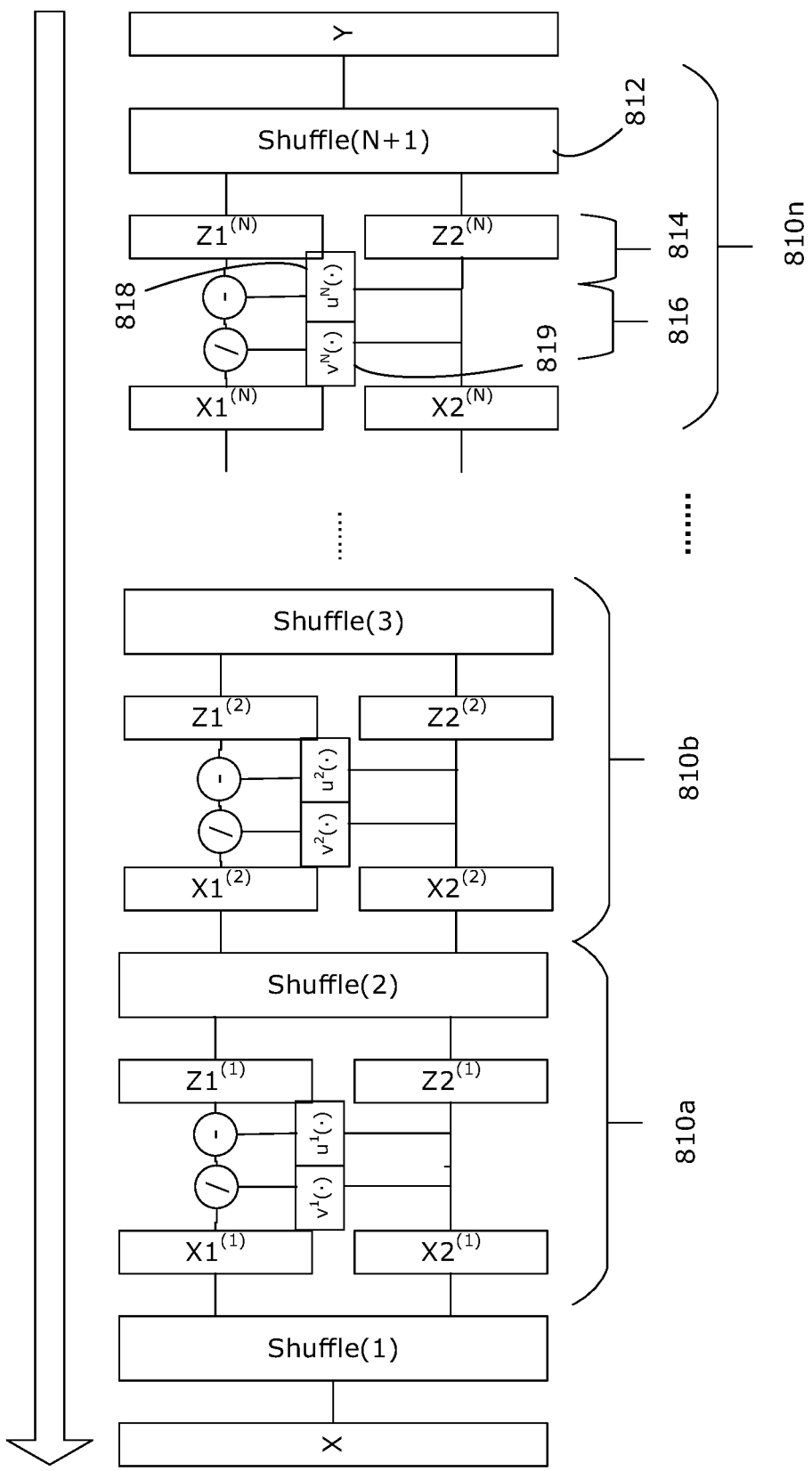
FIG. 13 is a schematic diagram illustrating an example generalized scaled offset polarization stream architecture, also referred to herein as a f-network.

FIG. 13 shows the corresponding scaled offset polarization stream f-network. The architecture shown in FIG. 13, when compared to the architecture of FIG. 10, introduces the scaling function v(•) 819 (with a division operator) to the polarization block 816. It should be noted that the offset function u(•) 818 and the scaling function v(•) 819 are the same between the g-network and the f-network. However, rather than element-wise addition and element-wise multiplication, the polarization block 816 in the f-network performs element-wise subtraction and element-wise division. Thus, each step 810 shuffles the input information, and splits the shuffled information into two information groups namely $\vec{Z1}$ (first information group) and $\vec{Z2}$ (second information group). The scaling function v(•) 819 is applied to the second information group to generate a scaling vector (v($\vec{Z2}$)), and the offset function u(•) 818 is applied to the second information group to generate an offset vector (u($\vec{Z2}$)). Both the scaling vector and the offset vector have dimension size equal to the first information group. The output of the step 810 is formed from $\vec{X1}$ (first output information group) and $\vec{X2}$ (second output information group). The second output information group is a copy of the second information group $\vec{Z2}$. The first output information group is obtained by element-wise subtracting the offset vector from the first information group, then element-wise dividing by the scaled vector. Mathematically, this may be represented as:

$\vec{X1}^{(n)} = (\vec{Z1}^{(n)} - u(\vec{Z2}^{(n)})) / v(\vec{Z2}^{(n)}))$ $\vec{X2}^{(n)} = \vec{Z2}^{(n)}$ $\vec{Z}^{(n)} = \text{shuffle}_n(\vec{X}^{(n+1)})$ The overall determinant for the f-network is $$\frac{1}{\prod_{n=1}^{N} v^n}.$$

The scaling function v(•) is useful for manipulating the likelihood distribution in various ways. For example, the introduction of the scaling function enables the source X distribution to be shaped to a target Y distribution having a double moon shape. Further, the addition of the scaling function helps to strengthen the polarization. Polarization may be thought of as essentially dimension-reduction. If a scaling factor on a given dimension approaches to zero, that given dimension collapses. A scaling factor on one given dimension can be considered as standard deviation. If the standard deviation is zero, this dimension is useless for transmitting the information entropy. When there is only the offset function, in order to have a polarized point or dimension (high reliability) there must be moving and summing of reliability from many other points or dimensions. With the addition of the scaling function, it becomes possible to directly depress reliability of some points or dimensions and boost reliability of other points or dimensions, which may help to improve efficiency and speed. Accordingly, low to high dimension conversion becomes possible and may be fast.

Together, the scaling function v( ) and the offset function u( ) may bring about desirable flexibility to "displace" or polarize the reliabilities over a signal space. This means that, at least in theory, shaping of the target distribution need not be limited by the number of the polarization steps and shuffle functions at each polarization step.

In the present disclosure, the term g-network may refer in general to the reverse scaled offset polarization stream architecture (or more simply the reverse polarization stream), as illustrated in the example of FIG. 12; and the term f-network may refer in general to the scaled offset polarization stream architecture (or more simply the polarization stream), as illustrated in the example of FIG. 13. It should be understood that FIGS. 6, 7, and 9 are special cases of the more general g-network shown in FIG. 12; and the FIGS. 8 and 10 are special cases of the more general f-network shown in FIG. 13.

In various examples of the present disclosure, the f-network and g-network architectures, including scaling and offset functions, may be implemented for receiver and transmitter, respectively. For example, in the ED 110 or BS 170 illustrated in FIGS. 1 and 3, the reverse polarization stream may be implemented in the transmitter 252, and the polarization stream may be implemented in the receiver 254. In an example, the reverse polarization stream may be implemented in the transmitter 252 of the BS 170 and the polarization stream may be implemented in the receiver 254 of the ED 110. However, it should be understood that the ED 110 may also perform transmission to the BS 170, such that the roles of transmitter and receiver may be interchanged. For example, the BS 170 may implement the polarization stream and the ED 110 may implement the corresponding reverse polarization stream. The BS 170 may implement multiple different polarization streams, each one corresponding to a different reverse polarization stream of a respective different ED 110.

In the transmitter 252, the reverse polarization stream is implemented as a cascade of one or more reverse polarization steps 610. Each reverse polarization step 610 includes a shuffle function (e.g., at shuffle block 612), a split function (e.g., at split block 614), an offset function 618 and a scaling function 619. The transmitter 252 uses the reverse polarization stream to shape a source signal in a lower dimensional signal space (filled zeros into higher dimensional space) to a target signal in a higher dimensional signal space, and then transmit the shaped target signal. In implementation, each reverse polarization step 610 may share a common shuffle block 612, a common split block 614, a common offset function 618 and/or a common scaling function 619 (each of which may be implemented using software, hardware or a combination of software and hardware). In an example implementation, each reverse polarization step 610 shares a common split block 614, a common offset function 618 and/or a common scaling function 619 but each reverse polarization step 610 has its own shuffle block 612. In the receiver 254, the polarization stream is implemented, which is the inverse of the reverse polarization stream. The polarization stream is a cascade of one or more polarization steps 810. Each polarization step 810 includes a shuffle function (e.g., at shuffle block 812), a split function (e.g., at split block 814), an offset function 818 and a scaling function 819. The receiver 254 uses the polarization stream to recover the source signal in a lower dimensional signal space from a received signal in a higher dimensional signal space and discarding low reliable dimensions. In implementation, each polarization step 810 may share a common shuffle block 812, a common split block 814, a common offset function 818 and/or a common scaling function 819 (each of which may be implemented using software, hardware or a combination of software and hardware). In an example implementation, each polarization step 810 shares a common split block 814, a common offset function 818 and/or a common scaling function 819 but each polarization step 810 has its own shuffle block 812.

The above discussion describes the use of the g-network in the transmitter and the f-network in the receiver. However, because both the f- and g-networks serve to displace likelihood distributions, it may also be possible to use the f-network for the transmitter and the g-network for the receiver.

Given a target distribution of Y and source distribution of X, and a fixed number of steps and shuffle functions in the f- and g-networks, the challenge becomes how to determine the suitable offset function u( ) and scaling function v( ) to achieve the desired distribution conversion. In the special case of a polar code, x=u(x) and 1=v( ).

In examples described herein, machine learning technology may be used to implement the functions u( ) and v( ), for example using deep neural networks (DNNs). Because each step in the reverse polarization stream is differentiable, back-propagation (from Y to X) is possible, which may enable training of DNNs. For successful implementation using DNNs, a loss or reward function needs to be defined (as well as regularization, if applicable) to ensure that the DNNs could be trained and converge in theory. In practice, there may be other factors that affect performance of a DNN and its training. One factor is the source and target distributions themselves. For example, a DNN's architecture (e.g., number of layers, number of neurons per layer) may be designed for specific distributions. For standardization purposes, the DNN architecture and polarization stream architecture may be defined for all transmitters/receivers.

The following is a discussion of the design of a suitable loss/reward function for training a DNN for the functions u( ) and v( ). A likelihood distribution Y conditional to likelihood distribution X in a multiple dimensional signal space may be represented as a summation or integral of a number of tiny signal sub-spaces, as follows:

$$p(y) = \int p(x) \cdot p(y|x:\theta) dx$$

where p(x) is the priori probability on every tiny signal subspace; $\theta$ represents the coefficients (weights and bias and thresholds) of a DNN; and p(y|x:$\theta$) is the likelihood probability of (X→Y) and is approximated by the DNN with the coefficients $\theta$ and input of p(x).

For a given target Y distribution $\tilde{p}(y)$, the aim is to achieve the converted Y (p(y)) to approach $\tilde{p}(y)$ as closely as possible. In other words, the aim is to maximize (y|x:$\theta$), the likelihood probability, that is represented as Maximum Likelihood:

$$(u_\theta, v_\theta)^* = \underset{(u_\theta, v_\theta)}{\operatorname{argmax}}(E_{y \sim \tilde{p}(y)}(p(y))) = \underset{(u_\theta, v_\theta)}{\operatorname{argmax}}(E_{y \sim \tilde{p}(y)}(\log(p(y))))$$

The formula above finds $(u_\theta, v_\theta)$ that maximizes the log(p(y)) measurement at the observation of $\tilde{p}(y)$.

As previously discussed, y=g(x) and x=f(y), and f( ) and g( ) are invertible to each other. Accordingly, either the g-network or the f-network may be equivalent, mathematically speaking, for training. However, from the machine learning point of view, the f-network is preferable. Firstly, the Y distribution has auto-regression characteristic as discussed previously, which the X distribution does not have. Therefore, if the f-network is used for training purposes, feature capture may be used, similar to image processing. Secondly, the likelihood probability p(y|x:$\theta$) in the g-network becomes posterior probability in the f-network. In many cases, the posterior probability is easier to be obtained than the likelihood probability. Thirdly, from Y distribution to X distribution, there is dimension reduction, in other words polarization. The g-network thus maps a low-dimensional X space to higher-dimension Y space. In the application to wireless communications, the g-network is implemented for a transmitter and the f-network is implemented for a receiver. This means that the transmitter uses the g-network to map low-dimensional X to higher-dimensional Y, which introduces an aspect of redundancy against interferences and noise during transmission. At the receiver, the f-network captures the low-dimensional features that are dispersed over the higher-dimensional space Y.

For training the f-network, the input is Y and the output is X. For training purposes, both Y and X are noised (e.g., to approximate real-world behavior). Although neither Y nor X need to be assumed to have Gaussian distribution over an entire signal space, when divided into tiny sub-spaces their projections on each tiny sub-space may be assumed to have Gaussian distribution in a typical wireless system. In order to achieve maximum likelihood over the entire signal space, the aim is to achieve maximum likelihood on each tiny sub-space.

At each tiny space, there is a D-sized block (D-dimension) X. Each element is independent to each other and follows N($\mu,\sigma$). This may be easily extended to a complex normal distribution. The likelihood distribution may thus be represented as:

$$p(x) = \frac{1}{(2\pi \cdot \sigma)^{\frac{D}{2}}} \cdot e^{-\frac{\|x-\mu\|^2}{2 \cdot \sigma^2}}$$

Then p(y) (given y=g(x) and x=f(y)) may be represented as:

$$p(y) = p(x) \cdot \det\left(\frac{\delta f(y)}{\delta y}\right) =$$

$$\frac{1}{(2\pi \cdot \sigma)^{\frac{D}{2}}} \cdot e^{-\frac{\|x-\mu\|^2}{2\sigma^2}} \cdot \det\left(\frac{\delta f(y)}{\delta y}\right) = \frac{1}{(2\pi \cdot \sigma)^{\frac{D}{2}}} \cdot e^{-\frac{\|f(y)-\mu\|^2}{2\sigma^2}} \cdot \det\left(\frac{\delta f(y)}{\delta y}\right)$$

$$\log(p(y)) = -\frac{D}{2}\log(2\pi \cdot \sigma) - \frac{\|f(y)-\mu\|^2}{2 \cdot \sigma^2} + \log\left(\det\left(\frac{\delta f(y)}{\delta y}\right)\right)$$

The maximum likelihood reward function (which is to be maximized) is:

$$-\frac{\|f(y)-\mu\|^2}{2 \cdot \sigma^2} + \log\left(\det\left(\frac{\delta f(y)}{\delta y}\right)\right)$$

Because the f-network is designed to have polarization at each step, the determinant is:

$$\det\left(\frac{\delta f(y)}{\delta y}\right) = \frac{1}{\prod_{n=1}^{N} v^n}$$

Accordingly, the reward function may be written as:

$$-\frac{\|f(y)-\mu\|^2}{2 \cdot \sigma^2} - \sum_{n=1}^{N} \log(v^n)$$

$v^n(\bullet)$ may be represented as $\exp(-w^n(\bullet))$, such that the reward function becomes:

$$-\frac{\|f(y; w_\theta, u_\theta)-\mu\|^2}{2 \cdot \sigma^2} + \sum_{n=1}^{N} w_\theta^n$$

In a wireless system, the distribution of X is deterministic (that is, having priori probability). The values of μ may thus be determined directly (e.g., based on known QAM constellation, OFDM symbols or 0/1 bits). The value of σ is related to the working signal-to-noise ratio (SNR). In an example wireless system, the modulation coding scheme (MCS) may define the targeted SNR.

Given a MCS, the modulation (μ), working SNR (σ), and code-length (D) may be determined. Given a targeted waveform Y, the f-network may thus be trained using supervised learning.

The reward function can be further divided into: A loss function (to be minimized) and a regulation function (to be maximized). Based on the above equations, the loss function is:

$$\|f(y; w_\theta, u_\theta)-\mu\|^2$$

The loss function thus takes the form of a minimum square error (MSE). The regulation function is:

$$\sum_{n=1}^{N} w_\theta^n$$

Thus, the f-network to be trained involves a DNN for the offset function $u''(\bullet)$ and a DNN for the scaling function $v''(\bullet) = \exp(-w''(\bullet))$. The input for training the DNNs is the target waveform Y having a target likelihood distribution. The training output X is characterized by modulation μ, working SNR σ, and code-length D, which are determined by the MCS. For example, in the example of FIG. 13, a first trained DNN may be used to implement the offset function 818, and a second trained DNN may be used to implement the scaling function 819. Once the f-network has been sufficiently trained, the inverse of the trained f-network may be used for the corresponding g-network. The g-network may be used as an inference network for the transmitter, and the receiver may use the f-network for the decoder. It should be noted that training of the DNNs to arrive at the offset function 818 and the scaling function 819 may be performed outside of the transmitter/receiver (e.g., may be performed offline or by another network entity). The transmitter/receiver only needs to know the architecture of the DNNs and the trained weights to use for the DNNs.

In some examples, instead of implementing the offset function and the scaling function using separate DNNs, the offset function and the scaling function may be implemented using a single DNN. For example, one DNN can receive the signal input and output both the scaling vector and the offset vector.

Whether implementation of the f- and g-networks is using a single DNN or using two DNNs may be standardized.

Another approach is to train the f- and g-networks in autoencoder mode. However, autoencoder training may not necessarily arrive at f( ) and g( ) that are invertible to each other.

It should be understood that the specific DNN architectures for $w_\theta$ and $u_\theta$ may be open for individual implementation. For example, the DNN architecture may be designed based on the particular application (e.g., the distribution conversion to be targeted). For real-world implementation, the specific DNN architecture that should be used for a given application may be standardized (e.g., in agreed upon industry standards). For example, standardization may include a standard definition of the type of neural network to be used, and certain parameters of the neural network (e.g., number of layers, number of neurons in each layer, etc.). Standardization may be application-specific. For example, a table may be used to list the standard-defined neural network parameters to be used for specific applications. Because the target signal and distribution shapes may be highly dependent on the specific environment and EDs, it may not be necessary to standardize the weights and coefficients of the trained DNNs. Standardization may also include a standard definition of the polarization stream architecture (e.g., the number of polarization steps in the cascade, the type of shuffle to be used). In the context of the wireless system 100 of FIG. 1, standardized definitions may be stored in the memory of the BS 170, to enable the BS 170 to select the appropriate polarization stream architecture and the appropriate DNN architecture to be trained for a particular wireless communication scenario.

Training of the DNN(s) (e.g., a single DNN implementing both scaling and offset functions, or separate DNNs for each of the scaling and offset functions) may be performed at the BS 170, and may be performed prior to or at the time of initial setup and association between the BS 170 and ED(s) 110. For example, when a new ED 110 is to be added for MIMO communications, the BS 170 may need to retrain the offset and scaling functions (implemented using one or two DNNs) in order to reshape the target signals to accommodate communications with the new ED 110 (e.g., to avoid interference with other EDs currently in communication with the BS 170). In some examples, it may be sufficient for the BS 170 to train the DNN(s) at the time of setup (e.g., initial association with one or more EDs). As well, the BS 170 may also perform training of the DNN(s) on-the-fly, for example in response to significant change in the associated EDs and/or the environment (e.g., addition of new ED, disassociation of an ED, significant change in ED mobility, change in ED state or significant change in channel, among other possibilities). After the BS 170 has trained the DNN(s), the BS 170 may forward the weights of the trained DNN(s) to the ED(s) 110, to be used in the receiver.

In some examples, training of the DNNs may be performed offline, for example using data collected by the BS 170. The collected data may represent different wireless communication scenarios, such as different times of day, different days of the week, different traffic levels, etc. Training may be performed for a particular scenario, to generate different sets of DNN weights for different scenarios. The different sets of weights may be stored in association with the different specific scenarios (e.g., in a look-up table), for example in the memory of the BS 170. The BS 170 may then select and use a particular set of weights for the DNN(s), in accordance with the specific scenario. For example, the BS 170 may determine that it is handling communications for a weekend evening (e.g., using information from an internal clock and/or calendar) and use the corresponding set of weights to implement the DNN(s) for the offset and scaling functions. This would result in the transmitter of the BS 170 performing signal shaping that is suitable for the level of wireless traffic that is typical for a weekend evening.

The BS 170 may also retrain the DNN(s) on-the-fly, in response to dynamic changes in the environment and/or in the EDs 110, as discussed above. Thus, the BS 170 may update the table of weights dynamically. In some examples, the table of weights may include sets of weights that are standardized (e.g., defined in standards for very common scenarios) and may also include sets of weights that are generated on-the-fly for certain scenarios.

The BS 170 may provide an indexed table of weights and associated scenarios to the associated ED(s) 110. The BS 170 may instruct (e.g., via a broadcast message) the ED(s) 110 a selected set of weights to use, for example by indicating the corresponding index of the selected set of weights. The BS 170 may retrain the DNN(s) and update the table of weights (e.g., in response to a new scenario) and communicate the updated table to the ED(s) 110. In some examples, the BS 170 may store a large table of weights and only provide a subset of the table to the ED(s) 110.

The above discussion refers to examples where the BS 170 performs training of the DNN(s). In other examples, training of the DNN(s) may not be performed by the BS 170. For example, the DNN training may be performed by the core network 130 or elsewhere in the wireless system 100 (e.g., using cloud computing). The BS 170 may simply collect the relevant data and forward the data to the appropriate network entity (e.g., the core network 130) to perform the necessary training. The weights of the trained DNN(s) may then be provided to the BS 170, for example to be stored in a memory of the BS 170.

Although the above discussion is in the context of the BS 170 in the role of a transmitter and the ED 110 in the role of a receiver, it should be understood that the transmitter and receiver roles may be reversed (e.g., for uplink communications). Further, it should be understood that the transmitter and receiver roles may be at two or more EDs 110a, 110b, 110c (e.g., for sidelink communications). The BS 170 (or core network 130 or other network entity) may perform the DNN training and may provide the trained weights to the ED 110 in order for the ED 110 to implement the DNN(s) for transmitting to the BS 170.

In the above discussion, a general deep polarization stream architecture has been described that shapes a source likelihood distribution to a target likelihood distribution. For a given number of the polarization steps, the shuffle functions at each step, and dimensions of the source and target distributions, DNN(s) could be trained to generate the v( ) and u( ) functions to achieve the desired likelihood distribution transformation.

It should be noted that the input X and output Y may have the same dimension sizes or different dimension sizes. Usually, in the wireless domain, a transmitter extends the dimensions for dimensional gain and diversity gain. By using the reverse polarization stream architecture described herein, a transmitter can shape and map signals in a lower dimensional signal space (X) into a higher dimensional signal space (Y). It may become possible to map a source signal space to any target signal space Y, and it is no longer necessary to assume a Gaussian distribution for Y.

Figure 14:
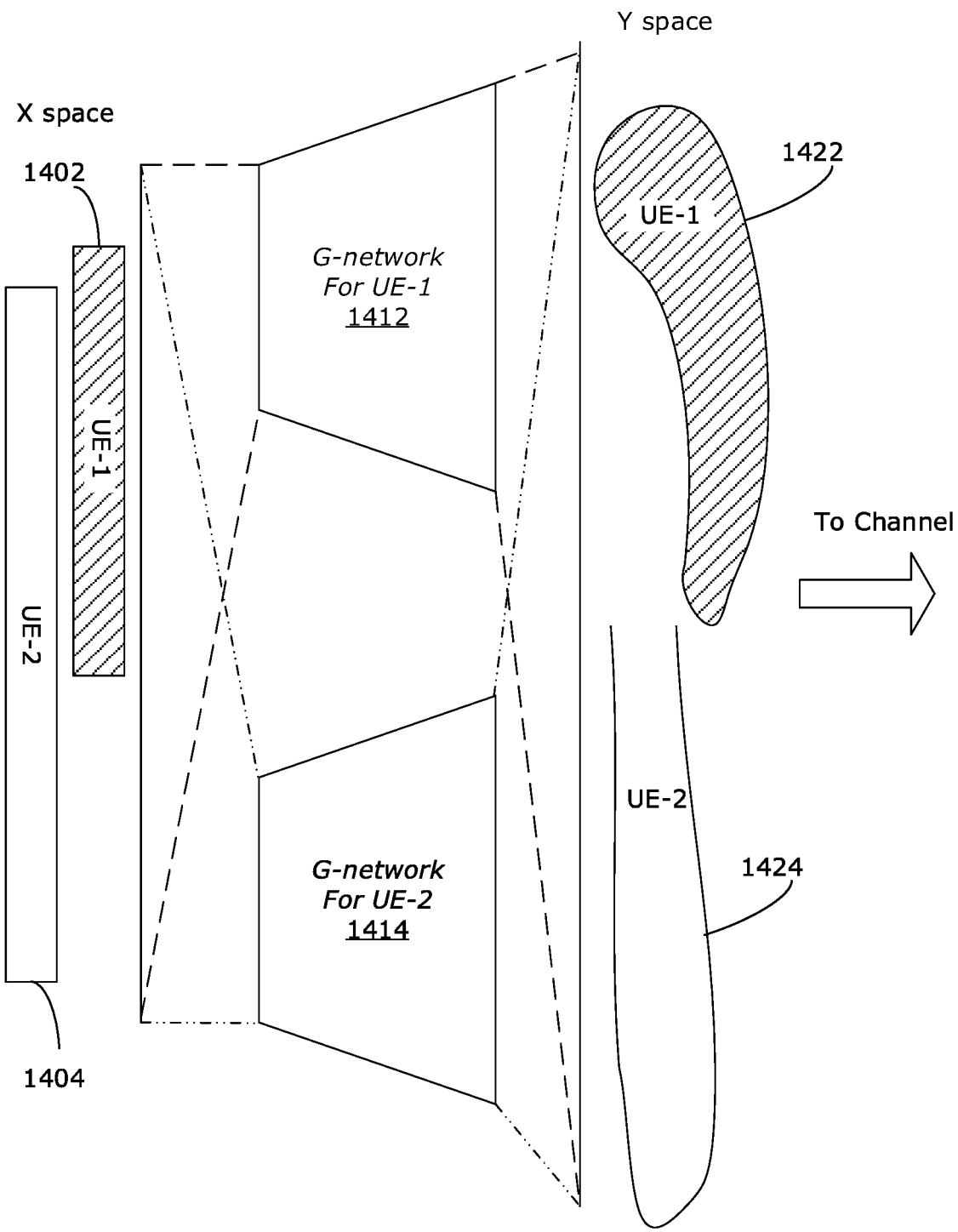
FIG. 14 illustrates an example of signal shaping at a transmitter that is transmitting to two devices, using the disclosed polarization stream architecture.

Multi-user communications may benefit from the approach disclosed herein. Reference is now made to FIG. 14, which illustrates the likelihood distribution shaping from X to Y, from the viewpoint of the transmitter. Consider the case where there are two EDs UE-1 and UE-2 being served by a BS. UE-1 has a first source signal likelihood distribution 1402 and UE-2 has a second source signal likelihood distribution 1404 in the low-dimensional X signal space. The source likelihood distributions 1402 and 1404 are overlapping in the X signal space. The transmitter (e.g., in the BS) uses a first g-network 1412 for shaping the first source signal likelihood distribution 1402 to a first target signal likelihood distribution 1422 for UE-1; and uses a second g-network 1414 for shaping the second source signal likelihood distribution 1404 to a second target signal likelihood distribution 1424. Each g-network 1412, 1414 may have a respective set of offset and scaling functions, in order to achieve the respective desired signal shaping. In particular, the g-networks 1412, 1414 may be designed (e.g., by training DNN(s) to implement offset and scaling functions as described above) to achieve target likelihood distributions 1422, 1424 that are well separated (e.g., after taking into account the effects of noise) in the higher-dimensional Y signal space. The shaped signals may then be transmitted over the channel by the BS, to be received by the EDs. Each ED may receive the signals in the Y signal space and use corresponding f-networks (which are the inverse of the g-networks 1412, 1414) to recover the source signals in the X signal space. Although FIG. 14 illustrates transmission to two EDs, it should be understood that the discussion above is equally applicable for transmission to more than two EDs.

In some examples, the transmitters (e.g., in the EDs) use a first g-network 1412 for shaping the first source signal likelihood distribution 1402 to a first target signal likelihood distribution 1422 for UE-1; and use a second g-network 1414 for shaping the second source signal likelihood distribution 1404 to a second target signal likelihood distribution 1424. Each g-network 1412, 1414 may have a respective set of offset and scaling functions, in order to achieve the respective desired signal shaping. In particular, the g-networks 1412, 1414 may be designed (e.g., by training DNN(s) to implement offset and scaling functions as described above) to achieve target likelihood distributions 1422, 1424 that are well separated (e.g., after taking into account the effects of noise) in the higher-dimensional Y signal space. The shaped signals may then be transmitted over the channel by the EDs, to be received by the BS. Each ED may transmit the signals in the Y signal space and use corresponding g-networks. BS may use the corresponding f-networks (which are the inverse of the g-networks 1412, 1414) to recover the source signals in the X signal space for UE-1 and UE-2 in parallel and independently.

Because the reverse polarization stream implemented at the transmitted is invertible, it may be sufficient to define the reverse polarization stream used by the transmitter. The polarization stream, for a given reverse polarization stream, can be readily determined and used by a receiver or decoder. Accordingly, it may be sufficient for only the transmitter to be defined in any standard. As well, it may be sufficient for the BS to inform the ED of the transmitter implementation, and the ED may itself determine the receiver implementation by calculating the inversion.

As previously explained, unlike a traditional Gaussian-assumption decoder or receiver, the disclosed deep polarization stream-based system does not require assumption of a Gaussian distribution. In a traditional receiver using the Gaussian assumption, the receiver must assume a Gaussian sphere encompassing the entire signal likelihood. To help in appreciating the impact of the Gaussian assumption, reference is now made to FIG. 15.

Figure 15:
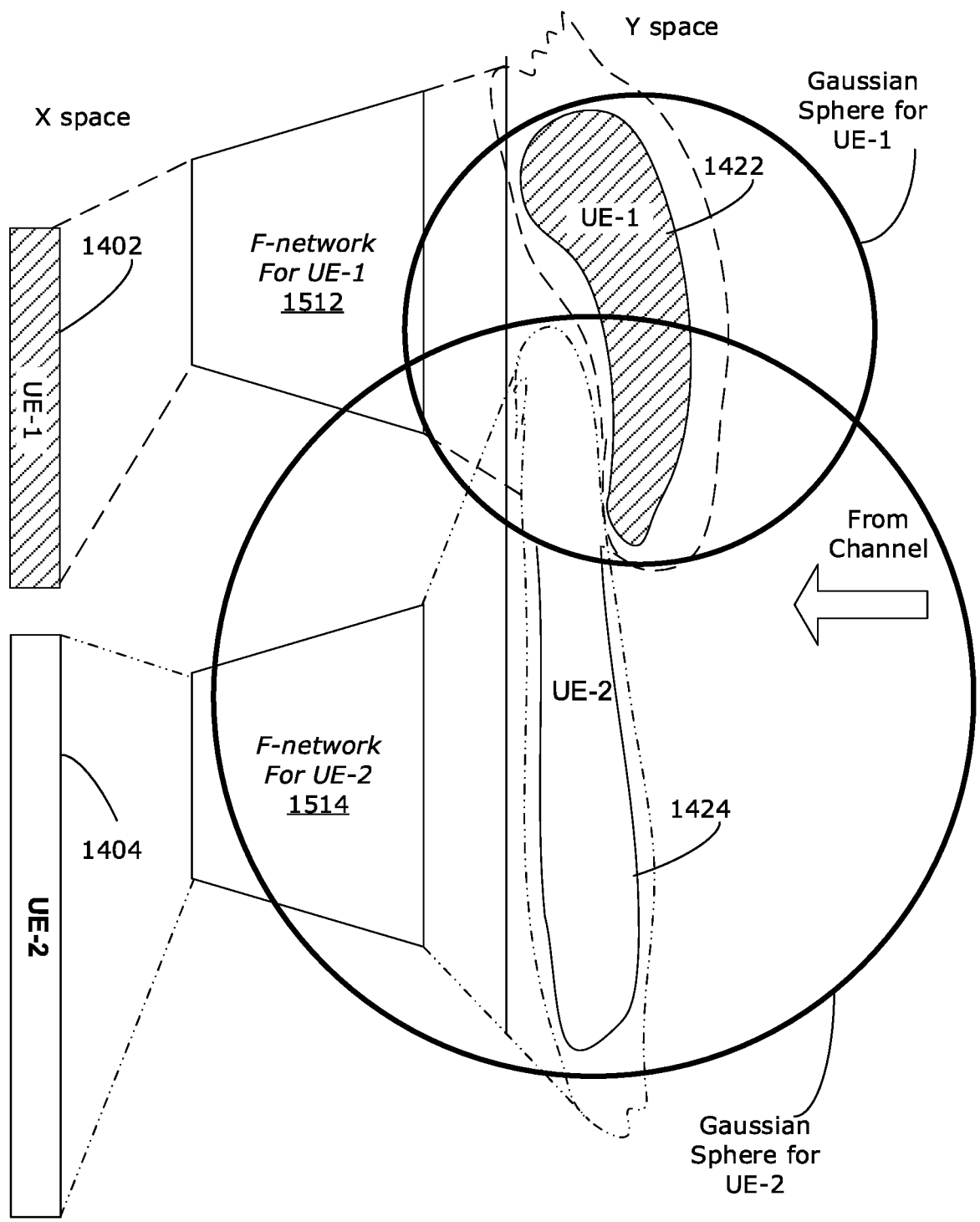
FIG. 15 illustrates an example of signal recovery at a receiver, using the disclosed polarization stream architecture, with assumed Gaussian spheres shown for comparison.

FIG. 15 illustrates the likelihood distribution shaping from Y to X using the disclosed polarization stream approach, from the viewpoint of the receiver. Although FIG. 15 illustrates signals intended for two EDs, it should be understood that the following discussion is equally applicable for signals intended to be received by more than two EDs. Consider the case where there are two EDs UE-1 and UE-2 being served by a BS. Each receiving ED receives signals having received signal likelihood distributions 1422, 1424 in the higher-dimensional Y signal space. The likelihood distributions 1422, 1424 may be noised (indicated by dashed lines surrounding each likelihood distribution 1422, 1424). UE-1 uses a first f-network 1512 to recover the first source signal likelihood distribution 1402 from the first received signal likelihood distribution 1422. Similarly, UE-2 uses a second f-network 1514 to recover the second source signal likelihood distribution 1404 from the second received signal likelihood distribution 1424.

In another example, consider the case where there are two EDs UE-1 and UE-2 simultaneously transmitting to a BS. The BS receives signals having received and multiplexed signal likelihood distributions 1422, 1424 in the higher-dimensional Y signal space. The likelihood distributions 1422, 1424 may be noised (indicated by dashed lines surrounding each likelihood distribution 1422, 1424). For UE-1's likelihood distribution 1422, the BS uses a first f-network 1512 to recover the first source signal likelihood distribution 1402 from the first received signal likelihood distribution 1422. Similarly, for UE-2's likelihood distribution 1424, the BS uses a second f-network 1514 to recover the second source signal likelihood distribution 1404 from the second received signal likelihood distribution 1424.

For comparison, FIG. 15 also illustrates the Gaussian sphere encompassing each received signal likelihood distribution 1422, 1424, if the Gaussian assumption is used. For example, the expectation is center of the sphere; and the variance is the radius of the sphere. As illustrated, the Gaussian spheres for the likelihood distributions 1422, 1424 overlap. Ideally two Gaussian spheres should have zero overlapping to avoid interference. In order to satisfy this ideal condition, it would be necessary to further separate the likelihood distributions 1422, 1424 in the Y signal space, resulting in lower spectrum efficiency. If there is some overlap between two Gaussian spheres, the receiver at the receiving ED on downlink or the receiving BS on uplink has to use some algorithm (e.g., Turbo receiver or interference cancellation) to account for the interference. Such algorithms tend to be relatively complex and expensive to implement. In contrast, a deep polarization stream receiver does not rely on the Gaussian assumption. Accordingly, using examples disclosed herein, the transmitter may shape target likelihood distributions 1422, 1424 to be more closely packed, for greater spectrum efficiency, without incurring significantly higher cost or complexity at the receiver. Unless two received signal distributions actually are overlapping each other, the receiver does not consider the distributions to be overlapping. In this context, the receiver at each ED or a BS-side receiver for each ED is a single-user receiver, and may not need to account for the signal intended for another ED.

This leads to the question of how to determine if two ED's signal distributions are overlapping in the high dimensional signal space, particularly when two (or more than two) ED's transmitted signals are subjected to different channel distortions and power attenuations. For generalization, consider the case where the signal distributions for each ED are subjected to different channel distortions and attenuations on uplink. For a given UE-P, the channel can be regarded as a function $f_p(\bullet)$ that reshapes the transmitted signal distributions in the signal space. Assume another UE-Q that transmits its signals on the same signal space but whose signals are subjected to a different channel, represented as another function $f_q(\bullet)$. Both signals are multiplexed together with additional white noise at the receiver, such that:

$$Y = f_p(Tx_p(Z_p)) f_q(Tx_q(Z_q)) + N$$

where Y is the received signal distribution, representing the probability distribution of the corresponding signal that would be received at the receiver; $Tx_p(\ )$ and $Tx_q(\ )$ are functions representing the physical layer transmitter of UE-P and UE-Q, respectively; $Z_p$ and $Z_q$ are the source bits of UE-P and UE-Q, respectively; and N is noise.

Assume that $<f_p(\ ), f_q(\ )>$ is known (e.g., through previous channel estimation, feedback or channel uplink/downlink reciprocality). If the overlap between the two received signals $f_p(Tx_p(Z_p))$ and $f_q(Tx_q(Z_q))$ could be known, it would be possible to adjust $<Tx_p(\ ), Tx_q(\ )>$ (e.g., by using the deep polarization streams discussed above) to yield the best separated multiplexed signal distributions on the common resource allocation.

Traditional methods for determining such separation of signal distributions typically depend on a large number of offline simulations, and a number of experience and heuristic formula. In the present disclosure, this measurement problem may be turned into a classification problem, which may be solved (indirectly) using machine learning technology (e.g., a DNN).

In examples of the present disclosure, a metric for determining overlap between two received signal distributions is the mutual information of $<f_p(Tx_p(Z_p)), f_q(Tx_q(Z_q))>$. The higher mutual information is, the more divergent the two signal distributions are. Through the use of a DNN, the receiver can measure the mutual information for the estimated $<f_p(\ ), f_q(\ )>$ and given $<Tx_p(\ ), Tx_q(\ )>$. The measurement of the mutual information may be fully learned from the received signal distributions themselves rather than requiring any heuristic deduction.

Figure 16A:
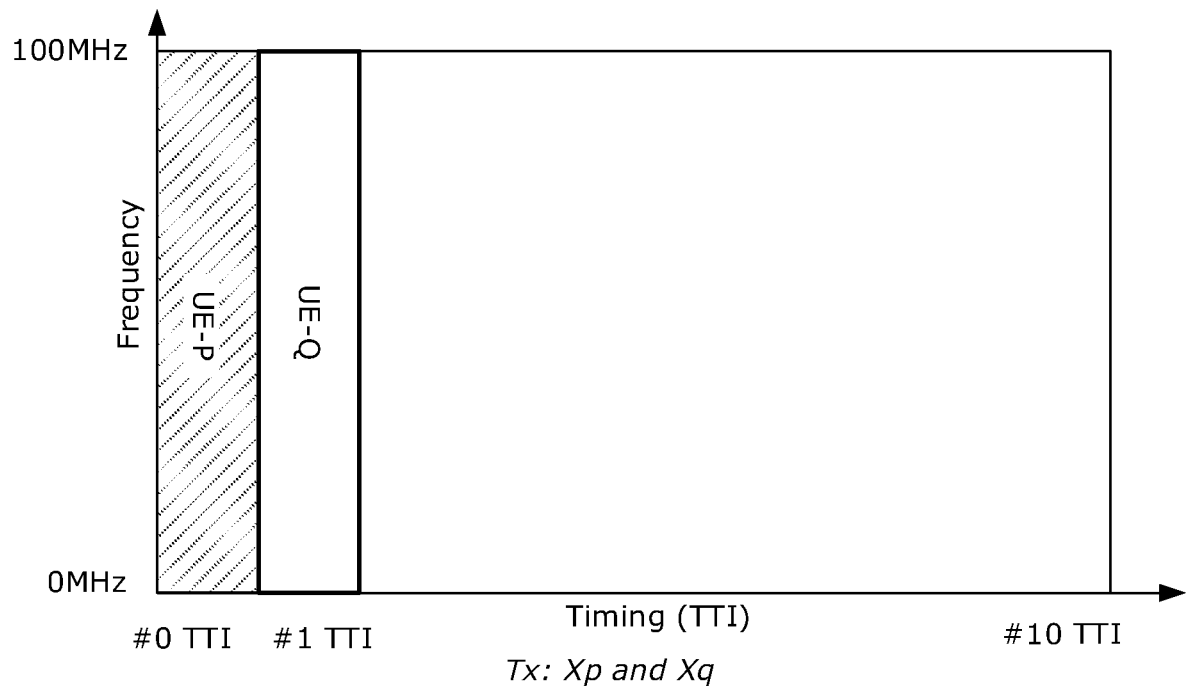
FIGS. 16A and 16B illustrate an example of separation and overlap of two multiplexed signals in the time-frequency domains.

FIG. 16A shows an example of TDMA (the simplest example in 2D signal space), in which the two signal distributions from UE-P and UE-Q are multiplexed into a common signal space (in this example, 10 TTI and 100 MHz). It may be noted that frequency and time are two orthogonal dimensions. Their projections on the frequency dimension are overlapping, but are completely separated on the time dimension. The result is that the signal distributions Xp and Xq are strictly distant from each other.

Figure 16B:
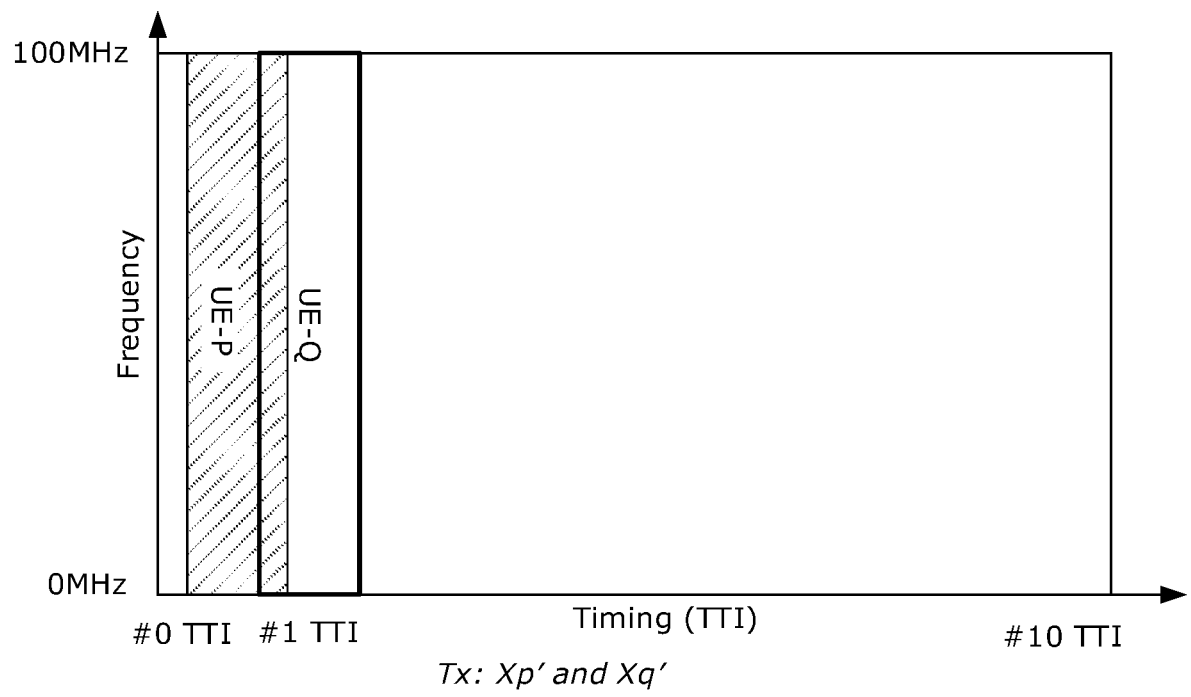

In FIG. 16B, a time delay has been introduced (e.g., due to channel distortion) to the signal from UE-P. Accordingly, MAI on the time dimension is observed at the receiver side. In other words, the probability that the signal distribution $X_p'$ appears at TTI #1 increases from zero to some non-zero uncertainty due to the channel distortion. The signal distributions from the two UEs are transmitted over the common signal space but with different receiving powers. Assume that they have a normalized power offset: wp and wq, where wp+wq=1. The mutual information I between Xp' and Xq' can be represented as a function of the normalized power offset $<w_p, w_q>$ and cross entropy $H_{cross}(Xp',Xq')=-\Sigma_i p(i) \cdot \log(q(i))$, as follows:

$$I(X_p', X_q') = w_p \cdot H_{cross}(X_p' \| w_p \cdot X_p' + w_q \cdot X_q') + w_q \cdot H_{cross}(X_q' \| w_p \cdot X_p' + w_q \cdot X_q')$$

The larger the mutual information $I(X_p', X_q')$ is, the more information the pair Xp' and Xq' will deliver. Similar to Shannon capacity limit, this mutual information has a limit that depends on $<w_p, w_q>$. Further, the mutual information $I(X_p', X_q')$ is symmetric, meaning $I(X_p', X_q')$, $I(X_q', X_p')$.

If $<w_p, w_q> = <\frac{1}{2}, \frac{1}{2}>$, then $I(X_p', X_q')$ is reduced to the Jenson-Shannon Divergence (JSD):

$$JSD(X_p', X_q') = \frac{1}{2} \cdot H_{cross}\left(X_p' \left| \frac{X_p' + X_q'}{2}\right.\right) + \frac{1}{2} \cdot H_{cross}\left(X_q' \left| \frac{X_p' + X_q'}{2}\right.\right)$$

Figure 17:
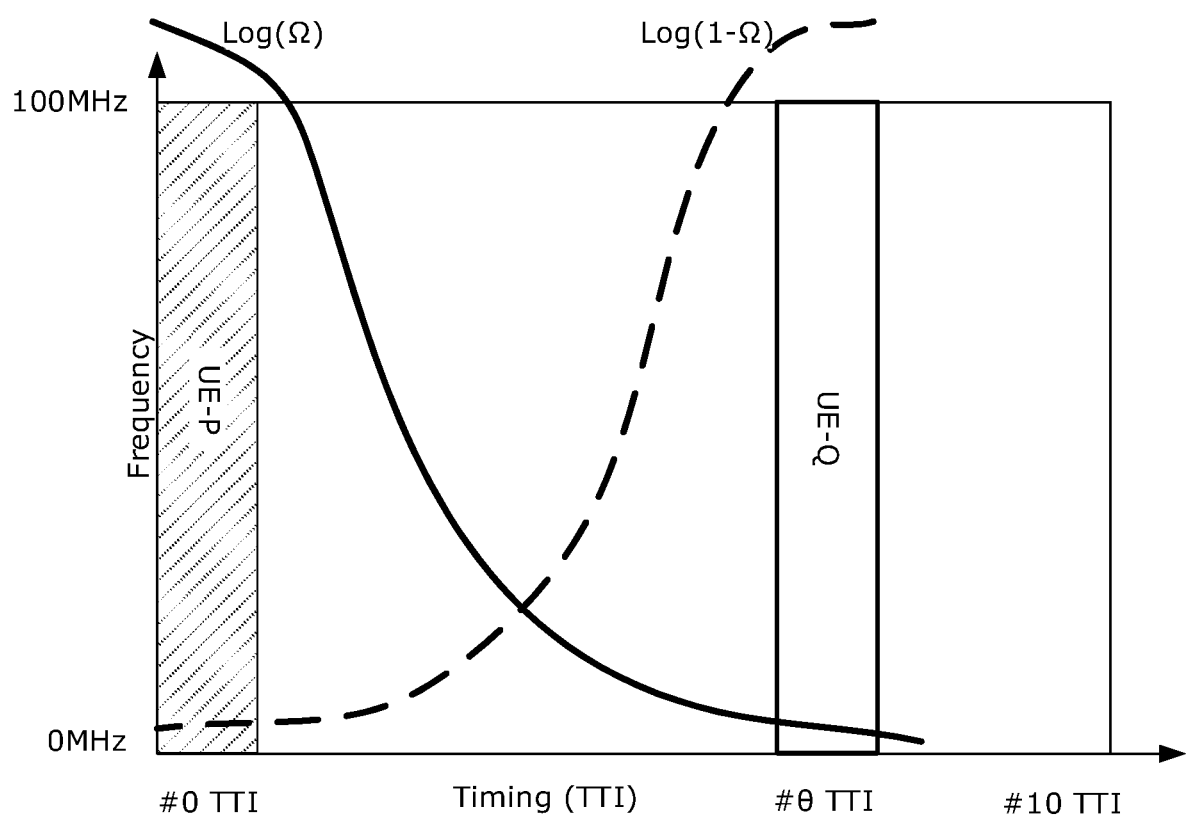
FIG. 17 illustrates an example of how separation of two signals in the time-frequency domains may be determined.

Consider an example of mutual information measurement, with reference to FIG. 17. Assume there are two UEs, UE-P and UE-Q, which are equally powered such that $<w_p, w_q> = <\frac{1}{2}, \frac{1}{2}>$. Assume the signal space has two dimensions, namely frequency (100 MHz) and time (10 TTIs), which is shared or multiplexed by UE-Q and UE-P. TDMA is used to separate the signal distributions from the two UEs. UE-P takes all the frequency band at TTI #0; whereas UE-Q takes all the 100 MHz band at TTI #θ. Channel distortions are not considered herein for simplicity.

In the case of θ>=1 (which is fully orthogonal in TDMA):

$$I(X_p', X_q') = \log(2)$$

Here, the mutual information $I(X_p', X_q')$ reaches its maximum value of (log(2)) for $<w_p, w_q> = <\frac{1}{2}, \frac{1}{2}>$. Xp' and Xq' are considered to be well divergent to each other and do not overlap.

In the case of θ=½ (which is partially overlapping in TDMA):

$$I(X_p', X_q') = \log\left(\frac{2}{3}\right)$$

Here, the mutual information $I(X_p', X_q')$ reaches a medium value (less than the maximum, but more than zero) to indicate the degree to which Xp' and Xq' are partially overlapping.

In the case of θ=0:

$$I(X_p', X_q') = 0$$

Here, the mutual information $I(X_p', X_q')$ reaches its minimum value of 0 for $<w_p, w_q> = <\frac{1}{2}, \frac{1}{2}>$. Xp' and Xq' are considered to be completely overlapping to each other.

Thus, if the mutual information reaches its maximum, the signal distributions Xp' and Xq' do not overlap, and a single-user detector can easily detect the signal(s) of interest.

The mutual information between Xp' and Xq' is:

$$I(X_p', X_q') =$$
$$w_p \cdot H_{cross}(X_p' \| w_p \cdot X_p' + w_q \cdot X_q') + w_q \cdot H_{cross}(X_q' \| w_p \cdot X_p' + w_q \cdot X_q')$$

$$\text{Let } \Omega(i) = \frac{w_p \cdot p(i)}{w_p \cdot p(i) + w_q \cdot q(i)} = w_p \cdot E_{UE_P}[\log(\Omega)] +$$
$$w_q \cdot E_{UE_Q}[\log(1 - \Omega)] + (-w_p \cdot \log(w_p)) + -w_q \cdot \log w_q$$

Figure 18A:
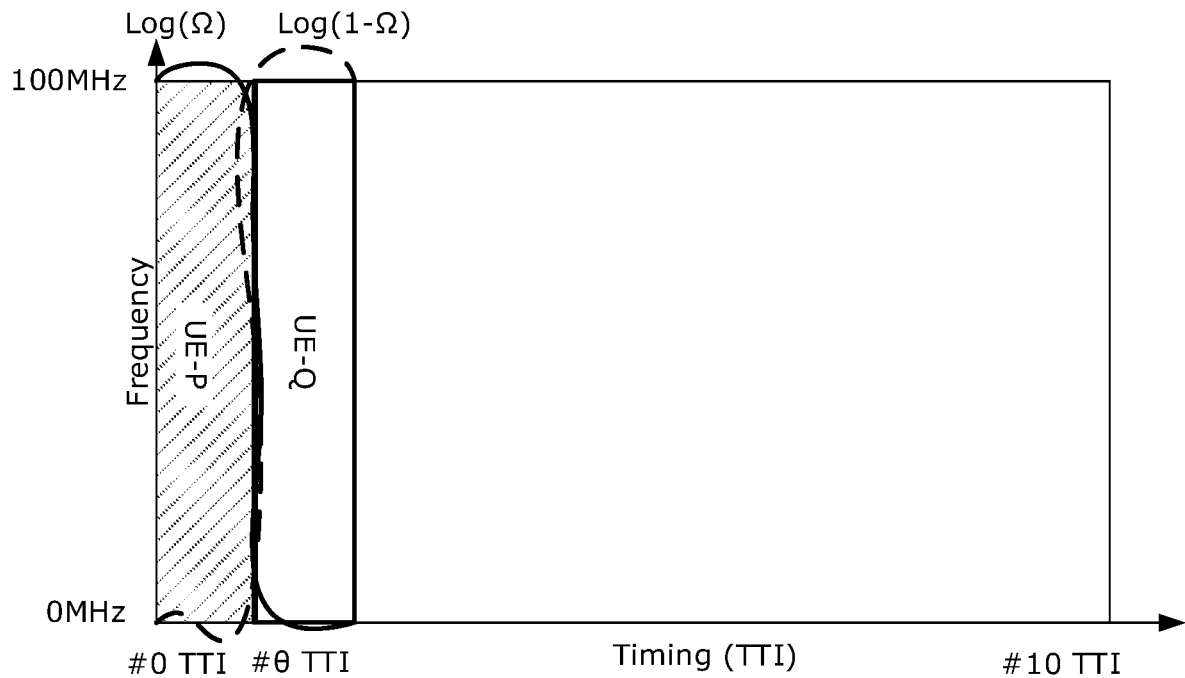
FIGS. 18A and 18B illustrate an example of how overlap of two signals in the time-frequency domains may be determined.
Figure 18B:
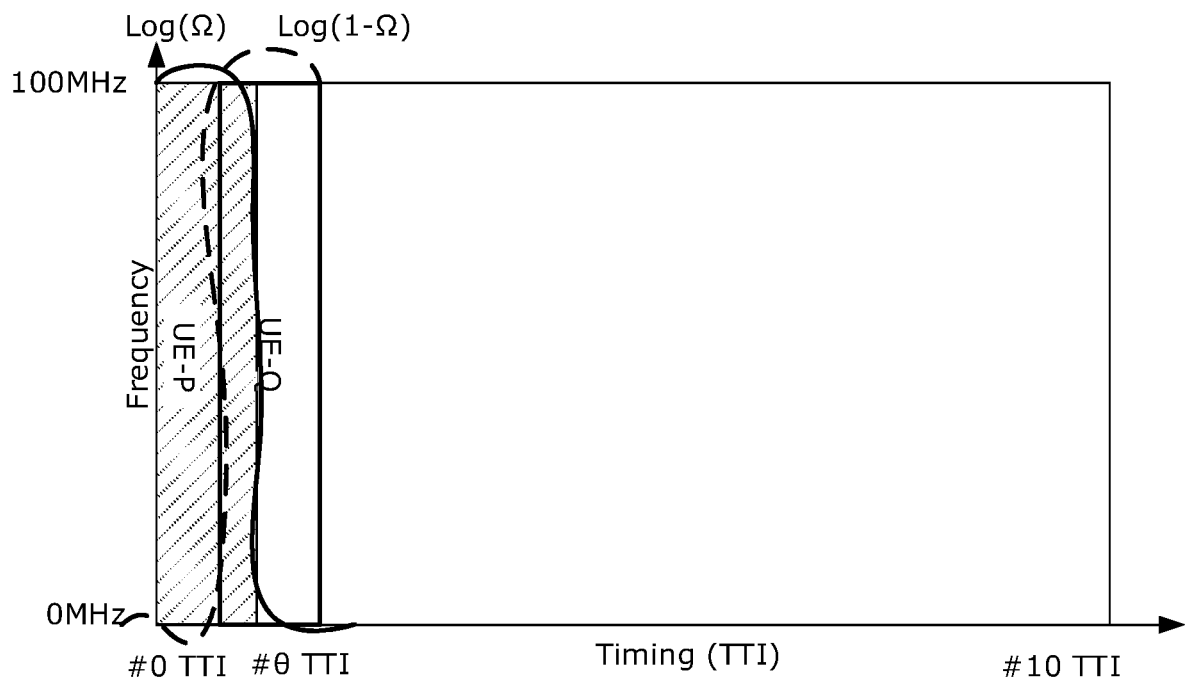

The mutual information measurement is thus: Given a $<X_p', X_q'>$, the function $\Omega_{p,q}$ is the best attempt to divide the two signal distributions. $\Omega_{p,q}$ is thus a function (or hyperplane) that attempts to divide the two signal distributions in the signal space. FIG. 17 illustrates this by plotting log(Ω) and log(1−Ω) separating the two signal distributions Xp' and Xq'. For comparison, FIG. 18A shows log(Ω) and log(1−Ω) for two signal distributions that are just touching (but not overlapping) in signal space (still fully orthogonal); and FIG. 18B shows log(Ω) and log(1−Ω) for two signal distributions that are overlapping in signal space (only partially orthogonal).

Instead of measuring the p(i) and q(i), it is sufficient to determine Ω(i) for each position in the signal space. At a position i in the space, it can be shown that:

$$\Omega(i) = \frac{w_p \cdot p(i)}{w_p \cdot p(i) + w_q \cdot q(i)} =$$
$$\varphi^*(i) = \underset{\varphi(i)}{\operatorname{argmax}}(w_p \cdot p(i) \cdot \log(\varphi(i)) + w_q \cdot q(i) \cdot \log(1 - \varphi(i)))$$

where Ω(i) is the solution in one position i. The overall solution is:

$$\Omega^*(Xp', Xq') =$$
$$\underset{\varphi}{\operatorname{argmax}}\left(w_p \cdot \sum_{i \in space} p(i) \cdot \log(\varphi(i)) + w_q \cdot \sum_{i \in space} (1 - p(i)) \cdot \log(1 - \varphi(i))\right)$$

The equation above may be considered a binary classification problem by maximizing the cross entropy. Classification problems have been well-studied in the field of neural networks. For example, DNNs have been used to perform image classification. A similar approach may be used to train a DNN to perform classification, in order to determine the similarity (representing the amount of separation or overlap) of Xp' and Xq'. For example, φ can be represented by a DNN (or CNN). Ω*(Xp', Xq') is a set of the coefficients of the DNN φ that can distinguish Xp' and Xq'.

Figure 19:
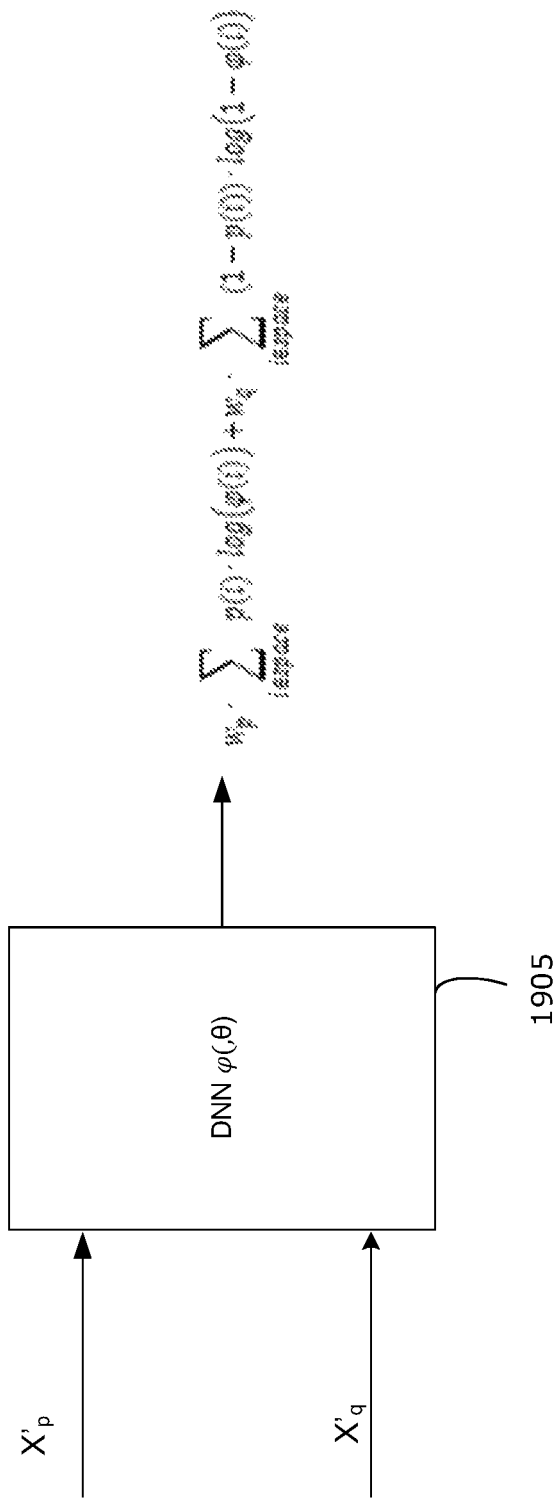
FIG. 19 is a schematic diagram of an example machine-learning based approach for determining overlap of two signals.

FIG. 19 illustrates an example DNN φ 1905, which may alternatively be a CNN. The DNN 1905 in this example is trained to classify an input signal space, here represented by the signal distributions Xp' and Xq' (although there may be more than two signal distributions) and output the cross entropy for all i. The target/loss function is actually to maximize $w_p \cdot \Sigma_{i \in space} p(i) \cdot \log(\varphi(i)) + w_q \cdot \Sigma_{i \in space}(1-p(i)) \cdot \log(1-\varphi(i))$. The output is a real value of the cross entropy between Xp' and Xq'. For example, a gradient ascent backward propagation can be used to train the DNN 1905:

$$\theta_\varphi \leftarrow \theta_\varphi + \eta \cdot \frac{\delta\left(w_p \cdot \sum_i p(i) \cdot \log(\varphi(\theta)) + w_q \cdot \sum_i (1-p(i)) \cdot \log(1-\varphi(\theta))\right)}{\delta\theta_\varphi}$$

After the DNN has been sufficiently trained (converges), the DNN can measure the cross entropy between Xp' and Xq'. For the input Y=Xp'+Xq', the output of the DNN is the measured maximum cross entropy:

$$V = w_p \cdot \sum_{i \in space} p(i) \cdot \log(\varphi^*(i)) + w_q \cdot \sum_{i \in space}(1-p(i)) \cdot \log(1-\varphi^*(i))$$
$$= w_p \cdot \sum_{i \in space} p(i) \cdot \log(\Omega(i)) + w_q \cdot \sum_{i \in space}(1-p(i)) \cdot \log(1-\Omega(i))$$

Comparing V and $I(X_p', X_q')$:

$$I(X_p', X_q') = w_p \cdot \sum_{i \in space} p(i) \cdot \log(\Omega(i)) + w_q \cdot \sum_{i \in space} q(i) \cdot \log(1-\Omega(i)) - (w_p \cdot \log(w_p) + w_q \cdot \log(w_q)) = V - (w_p \cdot \log(w_p) + w_q \cdot \log(w_q))$$

Figure 20:
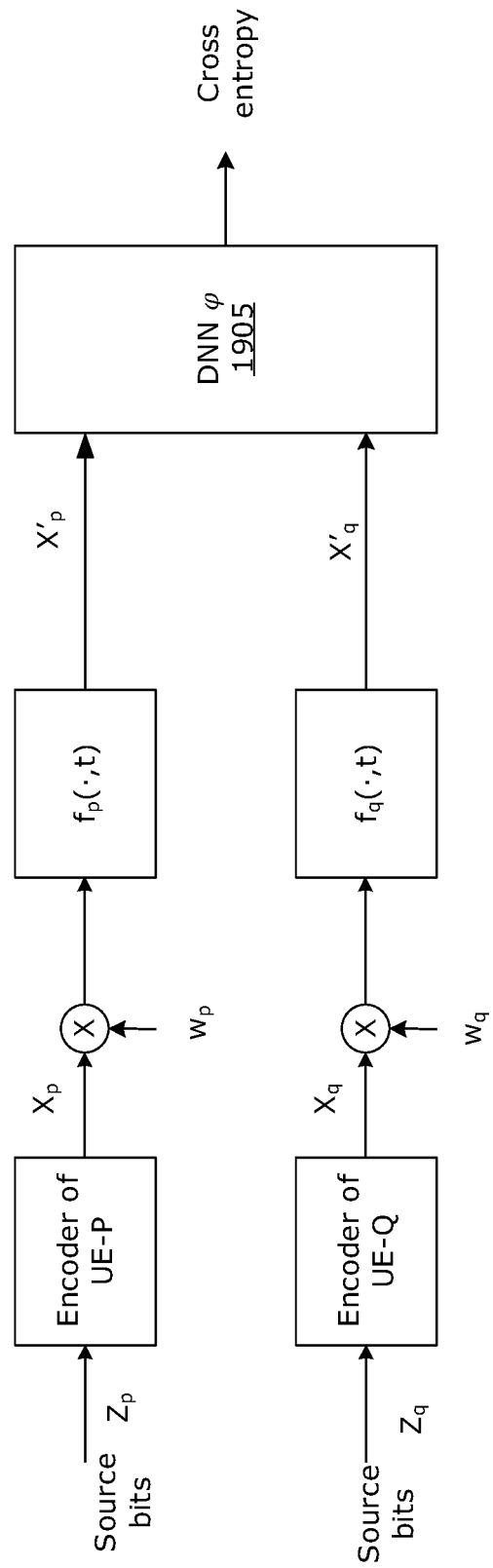
FIG. 20 is a schematic diagram of another example machine-learning based approach for determining overlap of two signals.

The above discussion is focused on the Q function, which divides two transmitted signal distributions. However, the greater concern the mutual information representing separation of the received signal distributions. This is schematically represented in FIG. 20. In FIG. 20, the source bits $Z_p$, $Z_q$ of UE-P and UE-Q, respectively, are each encoded by respective encoders to generate the source signal distributions $X_p$, $X_q$. The corresponding source signals are each transmitted with respective power $w_p$, $w_q$, and subjected to possible channel distortions $f_p(\bullet,t)$, $f_q(\bullet,t)$, to generate the received signal distributions Xp' and Xq'. Thus, the input to the DNN 1905 are Xp' and Xq', and the output is the measurement of cross entropy.

The receiver can average a number of V values (resulting from a number of input data) into $\bar{V}$. It has $\bar{V}$ less ($w_p \cdot \log(w_p) + w_q \cdot \log(w_q)$) to obtain the mutual information $I(X_p', X_q')$. It has a range [0, $-(w_p \cdot \log(w_p) + w_q \cdot \log(w_q))$]. The DNN 1905 may be used to measure the cross entropy between Xp' and Xq' corresponding to a set of candidate target Xp and Xq (which represent the probabilities of corresponding candidate target signals). If the DNN 1905 determines that there is sufficient separation of Xp' and Xq' (e.g., the cross entropy is maximized), then the candidate target signals having distributions Xp and Xq are selected as the target signal distributions for the polarization stream. The f-network may then be trained using the selected target signals as discussed above. If the DNN 1905 determines that there is insufficient separation of Xp' and Xq' (e.g., the cross entropy is close to 0), then a new set of candidate target distributions Xp and Xq should be generated (e.g., by increasing separation in one or more dimensions) and evaluated. It may be noted that using the DNN 1905 to measure cross entropy may indicate that two signal distributions are separated (i.e., having no overlap in signal space), however it may not quantify the amount of separation.

In the context of the example wireless system 100 of FIG. 1, the DNN 1905 may be implemented by the BS 170, in some examples. For example, when a new ED 110 joins the BS 170, the BS 170 may need to find a target signal distribution for the new ED 110 that does not interfere with other EDs 110 in the higher-dimensional Y signal space. The BS 170 may use the DNN 1905 (e.g., implemented by a general processor or a dedicated processor of the BS 170) to evaluate a candidate target signal distribution and determine if the candidate target signal distribution would be satisfactory for communications with the new ED 110. A candidate target signal distribution that is satisfactory may be a candidate signal distribution that does not overlap with existing communications with other EDs in the higher-dimensional Y signal space. In other words, a candidate target signal distribution would be satisfactory if the DNN 1905 outputs a cross entropy value that is maximized. Once the BS 170 finds a satisfactory target signal distribution for the new ED 110, the BS 170 may train the f-network in order to find the scaling and offset functions (e.g., implemented using a single DNN or two DNNs, separate from the DNN 1905) of the polarization stream (e.g., implemented in a corresponding reverse polarization stream in a transmitter of the BS 170 for downlink communications, or implemented in a transmitter of the ED 110 for uplink communications) that achieves the target signal distribution for the new ED 110. The BS 170 may then communicate with the new ED 110. In some examples, the evaluation of candidate target signal distributions may be performed by another entity in the system 100. For example, the BS 170 may request the core network 130 to find a satisfactory target signal distribution for the new ED 110. The core network 130 may implement the DNN 1905 in order to evaluate candidate target signal distributions and find the satisfactory target signal distribution for the new ED 110.

The examples discussed here describe the one or more DNNs used for implementing the scaling and offset functions as being separate from the DNN 1905 for outputting the cross entropy value. However, in some implementations, a single DNN may be used for outputting the cross entropy value, as well as for implementing the scaling and/or offset function. For example, a single DNN may be trained to output the cross entropy value for two candidate target signal distributions, and (if the cross entropy value indicates the candidate target signal distributions are sufficiently non-overlapping) be further trained to implement the scaling and offset functions for achieving the candidate target signal distributions.

Examples disclosed herein may be applicable to different wireless communication scenarios. For implementation in multiple access technology, for example, the multiplexed signal space of Y may be defined (e.g., by a standard) and the machine learning algorithm (e.g., DNN) may learn how to convert a regular signal to a target distribution area in Y for all signals to be multiplexed.

Figure 21:
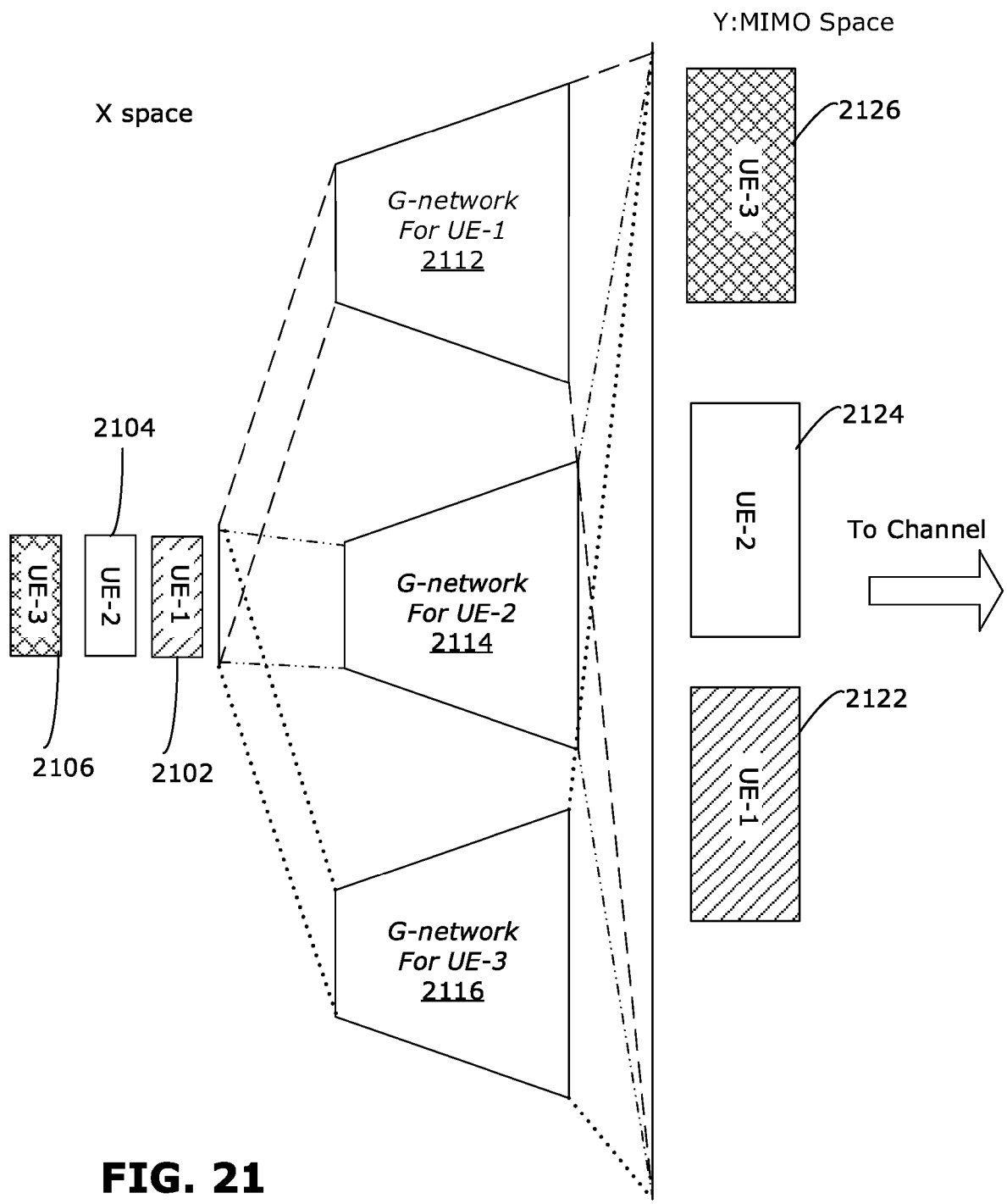
FIG. 21 illustrates an example of signal shaping at a transmitter using MU-MIMO technology, using the disclosed polarization stream architecture.

FIG. 21 illustrates an example of MU-MIMO. In this example, illustrated from the viewpoint of the transmitter (in this case a BS), there are source signals likelihood distributions 2102, 2104, 2106 for UE-1, UE-2 and UE-3, respectively, in the X signal space. The transmitter uses respective g-networks 2112, 2114, 2116 to shape each source signal likelihood distribution 2102, 2104, 2106 into a respective target likelihood distribution 2122, 2124, 2126 in the MIMO signal space (the multiplexed Y signal space). The multiplexed signal likelihood distributions 2122, 2124, 2126 may then be transmitted to UE-1, UE-2 and UE-3. Notably, the g-networks 2112, 2114, 2116 may be implemented using DNNs which have been trained to shape the source signal likelihood distributions 2102, 2104, 2106 into target distributions 2122, 2124, 2126 that do not overlap in the MIMO signal space. Thus, instead of solving the optimal equation for minimum mean square error (MMSE) pairing (as is traditionally done), a machine learning-based approach is used, which may be less computationally expensive. Each ED receiver may use a corresponding f-network as receiver to decode its own signals from MIMO received signal space (Y signal space with noise).

In a traditional approach, solving for MIMO pairing or grouping involves traversing all possibilities and solving an eigenvalue decomposition (EVD) problem with a large dimension. In practice, this is very costly and may be prohibitively costly for larger dimensions. In the present disclosure, using a deep polarization stream approach assisted by machine learning, this problem may be addressed.

Figure 22:
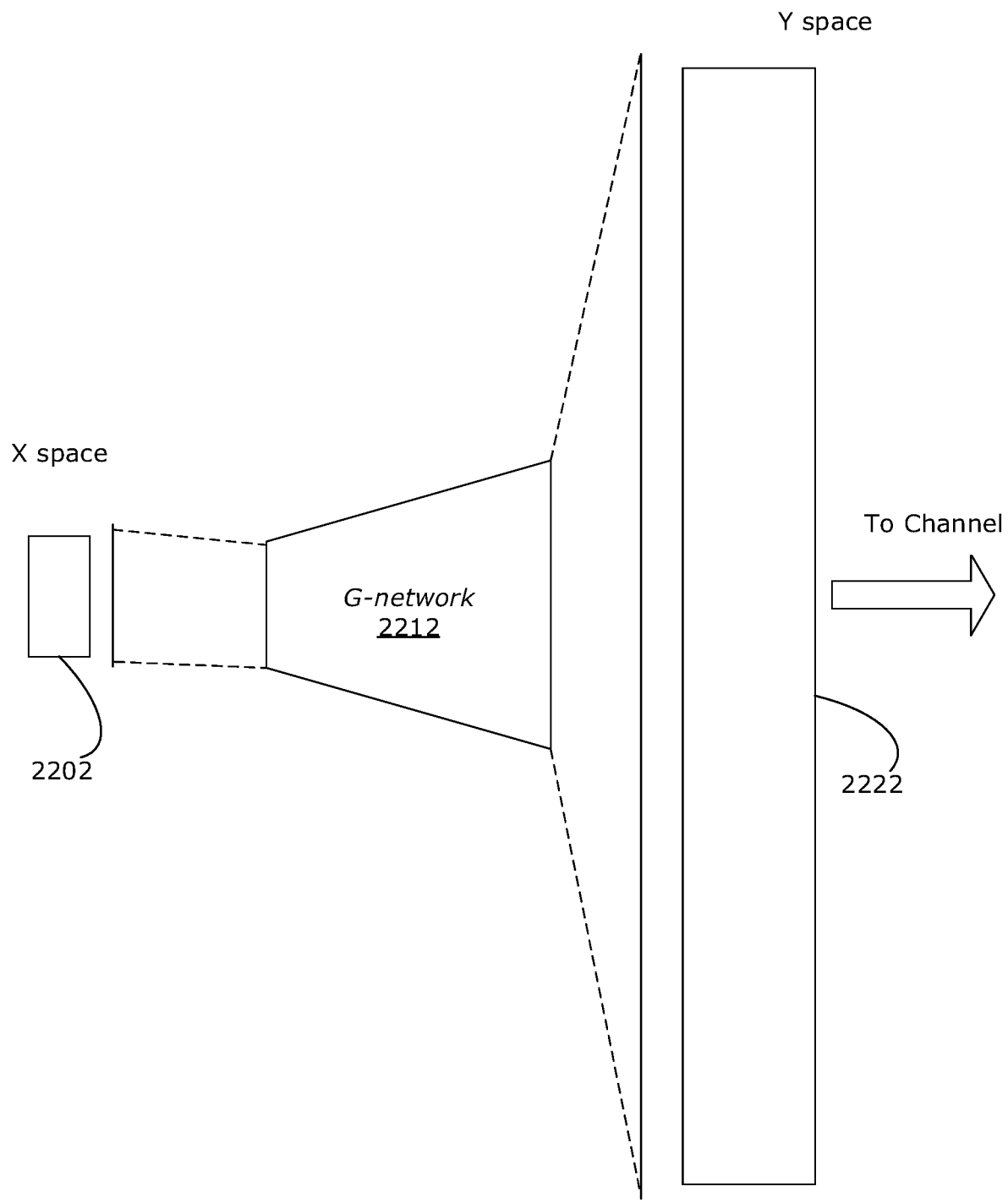
FIG. 22 illustrates an example of signal shaping at a transmitter for dimensional gain, using the disclosed polarization stream architecture.

Even for a single user system (e.g., broadcast communication), the deep polarization stream approach disclosed herein may be used to extend one low dimensional signal to fully occupy a higher dimensional signal space to maximize the dimensional gain. An example is illustrated in FIG. 22, which shows shaping of a transmission signal from X signal space to a higher dimensional Y signal space. As shown, the source signal likelihood distribution 2202 occupies a relatively small portion of the X signal space. The transmitter may use a trained g-network 2212 to shape the source signal likelihood distribution 2202 to a target signal likelihood distribution 2222 that occupies a larger portion of the Y signal space. If the shuffle functions at each step of the polarization stream are well designed, a successive-cancellation-based receiver receiving the transmitted signal may be used to fully take advantage of the dimensional gain.

Figure 23:
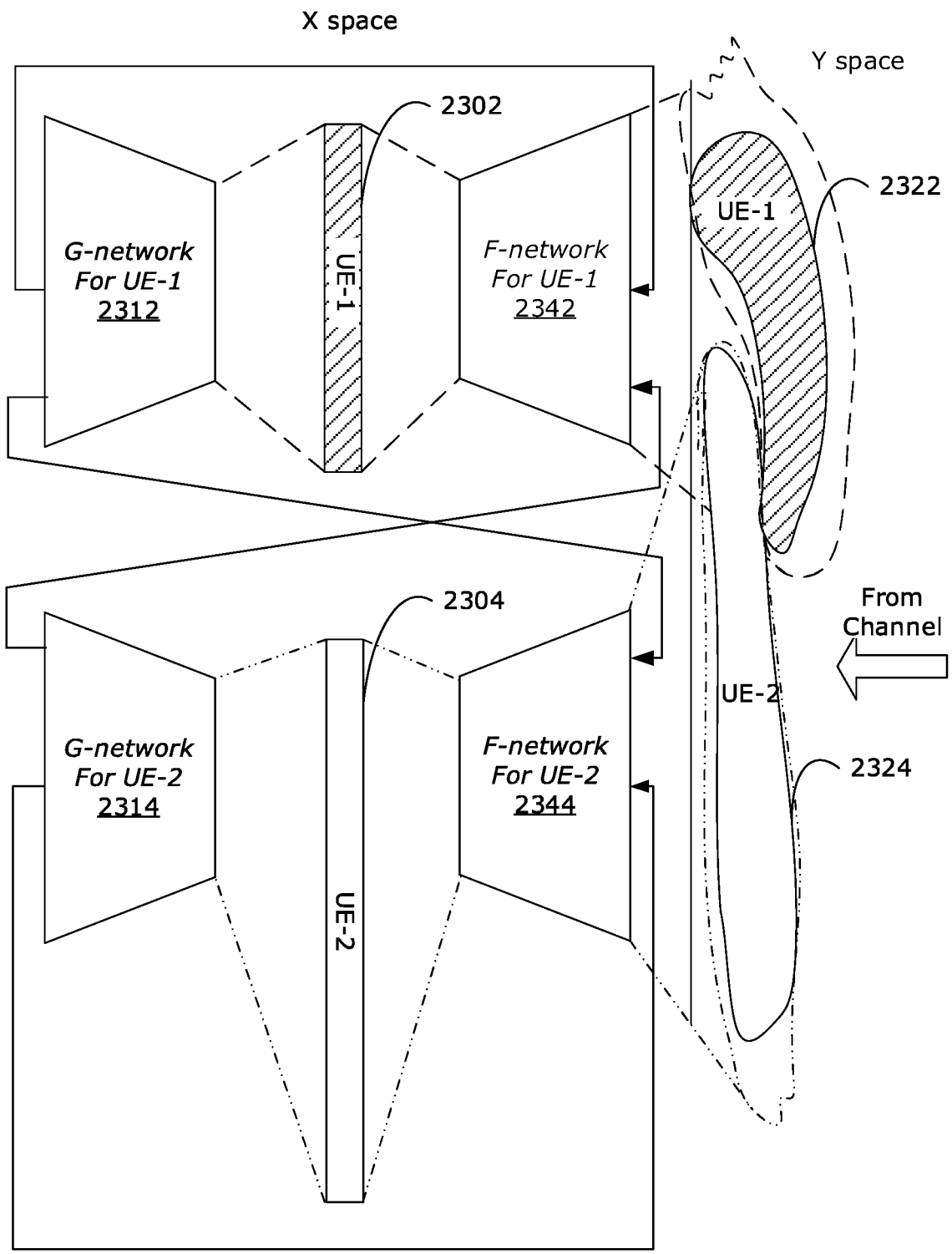
FIG. 23 illustrates an example of a receiver using the f-network and g-network iteratively to decode a signal.

In some examples, a receiver may use the f-network and g-network iteratively to further improve decoding performance. An example is illustrated in FIG. 23. In this example, there are two EDs, namely UE-1 and UE-2. A first receiver at UE-1 uses a first f-network 2342 to recover a first source signal likelihood distribution 2302 in lower-dimensional X signal space from a first received signal likelihood distribution 2322 (which may have added noise, as indicated by dashed line surrounding the signal likelihood distribution 2322) in higher-dimensional Y signal space. Similarly, a second receiver at UE-2 uses a second f-network 2344 to recover a second source signal likelihood distribution 2304 in X signal space from a second received signal likelihood distribution 2324 in Y signal space.

The first receiver may further convert the first source signal likelihood distribution 2302 to the Y signal space using a first g-network 2312, and iterate the result back to the first f-network 2342. A similar operation may be performed by the second receiver using a second g-network 2314. From a single-user point of view, a decoder that iterates between f-network and g-network is operating similar to a message-passing algorithm. If the f- and g-networks regularly drops out some neurons during the decoding, the decoder may behave similar to a successive-cancellation algorithm.

In some examples, the receiver is the BS, in which case the first and second f- and g-networks 2312, 2314, 2342, 2344 may all be implemented in the receiver of the BS. In such a scenario, the output of the first g-network 2312 may be provided to the second f-network 2344, and similarly the output of the second g-network 2314 may be provided to the first f-network 2342. From the multi-user point of view, if the reconstructed signals from one user are passed to the other, the receiver behaves similar to an interference-cancellation algorithm. Generally, because both f- and g-networks are known at the receiver, the receiver or decoder can evolve various different algorithms to help improve performance of the decoder.

The present disclosure includes examples that describe a BS in the role of a transmitter and an ED in the role of a receiver, for downlink communications. It should be understood that the present disclosure also applies to the scenario where the BS is in the role of a receiver and the ED is in the role of a transmitter, for uplink communications; and to the scenario where multiple EDs are in the roles of transmitter and receiver, for sidelink or device-to-device (D2D) communications. The BS may generally determine the DNN(s) and weights for implementing the f- and g-networks, and may communicate this information to the relevant ED(s). Where the BS is in communication with multiple EDs, the BS may use multiple f- and/or g-networks in parallel for communicating with the different EDs.

In examples described above, the offset and scaling functions may be implemented using two neural networks, or both offset and scaling functions may be implemented using one neural network.

In examples described herein, the g-network has been described as being used for the reverse polarization stream for the transmitter, and the f-network has been described as being used for the polarization stream for the receiver. However, in other examples, the f-network may be used for the transmitter and the g-network may be used for the receiver.

Although the present disclosure describes methods and processes with steps in a certain order, one or more steps of the methods and processes may be omitted or altered as appropriate. One or more steps may take place in an order other than that in which they are described, as appropriate.

Although the present disclosure is described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., a personal computer, a server, or a network device) to execute examples of the methods disclosed herein. The machine-executable instructions may be in the form of code sequences, configuration information, or other data, which, when executed, cause a machine (e.g., a processor or other processing device) to perform steps in a method according to examples of the present disclosure.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. An apparatus for wireless communications the apparatus comprising:
    a transmitter configured to implement a reverse polarization stream to shape a first source signal in a first signal space to a first target signal in a second signal space, wherein the reverse polarization stream is implemented as a cascade of one or more reverse polarization steps, each reverse polarization step including:
        a shuffle function that shuffles an input set of information and outputs a shuffled set of information;
        a split function that splits the shuffled set of information and outputs a first split information group and a second split information group;
        a scaling function applied to the second split information group to generate a scaling vector; and
        an offset function applied to the second split information group to generate an offset vector; and
        the reverse polarization step outputting a first output information group and a second output information group that together form an output set of information, the first output information group being: the first split information group element-wise multiplied with the scaling vector, and element-wise added with the offset vector; and the second output information group being the second split information group; and
    the transmitter is further configured to transmit the first target signal to at least one recipient device.

2. The apparatus of claim 1 wherein the reverse polarization stream is invertible to a polarization stream which recovers the first source signal from the first target signal, the shuffle function, split function, scaling function and offset function being the same in the polarization stream.

3. The apparatus of claim 1 wherein all the reverse polarization steps in the reverse polarization stream share at least: a common shuffle function, a common split function, a common scaling function, or a common offset function.

4. The apparatus of claim 1 wherein the scaling function and the offset function are implemented using at least one neural network.

5. The apparatus of claim 4 wherein the scaling function is implemented using a first neural network, and the offset function is implemented using a second neural network.

6. The apparatus of claim 4 wherein the reverse polarization stream is invertible to a polarization stream which recovers the first source signal from the first target signal, wherein the at least one neural network is trained on the polarization stream.

7. The apparatus of claim 6 wherein the apparatus is a base station, and the base station is configured to transmit trained weights of the at least one neural network to at least one electronic device, to enable the at least one electronic device to implement the polarization stream.

8. The apparatus of claim 6 wherein the apparatus is an electronic device, and the electronic device is configured to receive, from a base station, trained weights of the at least one neural network, to enable the electronic device to implement the reverse polarization stream.

9. The apparatus of claim 1 wherein the transmitter is configured to implement a first reverse polarization stream to shape the first source signal to the first target signal, and a second reverse polarization stream to shape a second source signal in the first signal space to a second target signal in the second signal space, wherein the first target signal is for transmission to a first recipient device and the second target signal is for transmission to a second recipient device.

10. The apparatus of claim 9 wherein the first and the second source signal are overlapping in the first signal space, and wherein the first and the second target signals are non-overlapping in the second signal space, wherein the first target signal and the second target signal are transmitted as a multiplexed signal.

11. The apparatus of claim 1 wherein the first source signal is shaped to the first target signal to achieve dimensional gain.

12. An apparatus for wireless communications, the apparatus comprising:
    a receiver configured to receive a first received signal from a transmitting device;
    the receiver being further configured to implement a polarization stream to recover a first source signal in a first signal space from the first received signal in a second signal space, wherein the polarization stream is implemented as a cascade of one or more polarization steps, each polarization step including:
        a shuffle function that shuffles an input set of information and outputs a shuffled set of information;
        a split function that splits the shuffled set of information and outputs a first split information group and a second split information group;
        a scaling function applied to the second split information group to generate a scaling vector; and
        an offset function applied to the second split information group to generate an offset vector; and
        the polarization step outputting a first output information group and a second output information group that together form an output set of information, the first output information group being: the offset vector element-wise subtracted from the first split information group, and element-wise divided by the scale vector; and the second output information group being the second split information group.

13. The apparatus of claim 12 wherein the scaling function and the offset function are implemented using at least one neural network.

14. The apparatus of claim 13 wherein the scaling function is implemented using a first neural network, and the offset function is implemented using a second neural network.

15. The apparatus of claim 13 wherein the at least one neural network is trained on the polarization stream, the polarization stream being invertible to a reverse polarization stream which shapes the first source signal to a first target signal for transmission.

16. The apparatus of claim 15 wherein the apparatus is a base station, and the base station is configured to transmit trained weights of the at least one neural network to at least one electronic device, to enable the at least one electronic device to implement the reverse polarization stream.

17. The apparatus of claim 13 wherein the apparatus is an electronic device, and wherein the at least one neural network is implemented using trained weights received from a base station.

18. The apparatus of claim 12, wherein the apparatus is a base station in communication with a first electronic device and a second electronic device, wherein the receiver is configured to implement a first polarization stream for recovering the first source signal, from the first electronic device, from a received multiplexed signal, and is further configured to implement a second polarization stream for recovering a second source signal, from the second electronic device, from the received multiplexed signal.

19. The electronic device of claim 12 wherein the receiver is further configured to implement a reverse polarization stream that is an inverse of the polarization stream, and is further configured to iteratively use the polarization stream and the reverse polarization stream to recover the first source signal.

* * * * *